United States Patent
Schulte et al.

(10) Patent No.: US 8,969,512 B2
(45) Date of Patent: Mar. 3, 2015

(54) POLYMERS HAVING CARBAZOLE STRUCTURAL UNITS

(75) Inventors: Niels Schulte, Kelkheim (DE); Anna Hayer, Mainz (DE); Aurélie Ludemann, Frankfurt am Main (DE)

(73) Assignee: Merck Patent GmbH (DE)

( * ) Notice: Subject to any disclaimer, the term of this patent is extended or adjusted under 35 U.S.C. 154(b) by 0 days.

(21) Appl. No.: 13/813,709

(22) PCT Filed: Aug. 1, 2011

(86) PCT No.: PCT/EP2011/003843
§ 371 (c)(1),
(2), (4) Date: Feb. 1, 2013

(87) PCT Pub. No.: WO2012/019724
PCT Pub. Date: Feb. 16, 2012

(65) Prior Publication Data
US 2013/0137818 A1 May 30, 2013

(30) Foreign Application Priority Data

Aug. 9, 2010 (DE) .................. 10 2010 033 777

(51) Int. Cl.
*C08G 73/06* (2006.01)
*C08G 61/12* (2006.01)
*H01L 51/00* (2006.01)
*C09K 11/06* (2006.01)
*H05B 33/14* (2006.01)
*H05B 33/22* (2006.01)
*H01L 51/50* (2006.01)

(52) U.S. Cl.
CPC ............ *C08G 73/0672* (2013.01); *C08G 61/12* (2013.01); *C08G 61/124* (2013.01); *H01L 51/0036* (2013.01); *H01L 51/0039* (2013.01); *H01L 51/0043* (2013.01); *C09K 11/06* (2013.01); *H05B 33/14* (2013.01); *H05B 33/22* (2013.01); *C08G 2261/1412* (2013.01); *C08G 2261/1434* (2013.01); *C08G 2261/149* (2013.01); *C08G 2261/3142* (2013.01); *C08G 2261/3162* (2013.01); *C08G 2261/3241* (2013.01); *C08G 2261/512* (2013.01); *C08G 2261/526* (2013.01); *C08G 2261/90* (2013.01); *C08G 2261/91* (2013.01); *C08G 2261/92* (2013.01); *C08G 2261/95* (2013.01); *H01L 51/0085* (2013.01); *Y02E 10/549* (2013.01); *C09K 2211/1029* (2013.01); *C09K 2211/185* (2013.01); *H01L 51/5056* (2013.01); *H01L 51/5088* (2013.01)
USPC ............ 528/423; 528/422; 313/507; 524/612

(58) Field of Classification Search
None
See application file for complete search history.

(56) References Cited

U.S. PATENT DOCUMENTS

| | | | |
|---|---|---|---|
| 2006/0046172 A1 | 3/2006 | Vaitkeviciene et al. | |
| 2008/0097076 A1* | 4/2008 | Radu et al. | 528/422 |
| 2008/0269461 A1* | 10/2008 | Van Dijken et al. | 528/423 |
| 2009/0134788 A1* | 5/2009 | Yamada et al. | 313/504 |
| 2010/0219404 A1 | 9/2010 | Endo et al. | |

FOREIGN PATENT DOCUMENTS

| | | |
|---|---|---|
| CN | 101220137 A | 7/2008 |
| GB | 2376469 A | 12/2002 |
| WO | WO-2004055129 A1 | 7/2004 |
| WO | WO-2004072205 A2 | 8/2004 |
| WO | WO-2009038413 A2 | 3/2009 |
| WO | WO-2009041635 A1 | 4/2009 |

OTHER PUBLICATIONS

Journal of the American Chemical Society, Brunner et al., Carbazole Compounds as Host Materials for Triplet Emitters in Organic Light-Emitting Diodes: Tuning the HOMO Level without Influencing the Triplet Energy in Small Molecules, vol. 126, No. 19, 2004, p. 6035-6042.*
Wu, Chung-Wen, et al., Synthesis and Characterization of Kinked and Hyperbranched Carbazole/Fluorene-Based Copolymers, Macromolecules, vol. 39, (2006), pp. 7232-7240.
International Search Report for PCT/EP2011/003843 mailed Dec. 7, 2011.

* cited by examiner

*Primary Examiner* — Susannah Chung
*Assistant Examiner* — Robert T Butcher
(74) *Attorney, Agent, or Firm* — Drinker Biddle & Reath LLP

(57) ABSTRACT

The present invention relates to polymers which contain at least one carbazole structural unit of the general formula (I) where Ar1, Ar2, Ar3 is each, independently of one another, an aryl or heteroaryl¬ group, which may be substituted by one or more radicals R of any desired type; m, o is, independently of one another, 0 or 1; n is 1, 2 or 3 and the dashed lines represent the linking in the polymer; and at least one arylamine structural unit of the general formula (II) and/or (III) where Ar4, Ar5, Ar7, Ar8 is each, inde¬ pendently of one another, an aryl or heteroaryl group, which may be substituted by one or more radicals R of any desired type; Ar6 is an aryl or heteroaryl group, which may be substituted by one or more radicals R of any desired type, or represents a group of the formula Ar9-Y—Ar9, where Ar9 is in each case, independently, an aryl or heteroaryl group, which is substituted by one or more radi¬ cals R of any desired type or which may be linked to one another, and Y is a spacer group or a direct bond; p is 1, 2 or 3; q is 0 or 1 and the dashed lines represent the linking in the polymer. Furthermore, the present invention relates to processes for the preparation of these polymers and to formulations and electronic devices which comprise these polymers.

19 Claims, 2 Drawing Sheets

| 3 nm / 100 nm | Cathode | Ba/Al |
| 65 nm | EML | M1 + E1 or M2 + E1 |
| 20 nm | HTL | Polymer P1 - P5 or V1 |
| 80 nm | HIL | PEDOT |
| | ITO | |

PRIOR ART

POLYMERS HAVING CARBAZOLE STRUCTURAL UNITS

CROSS-REFERENCE TO RELATED APPLICATIONS

This application is a national stage application (under 35 U.S.C. §371) of PCT/EP2011/003843, filed Aug. 1, 2011, which claims benefit of German application 10 2010 033 777.3, filed Aug. 9, 2010 which are both incorporated by reference.

BACKGROUND OF THE INVENTION

The present invention relates to polymers having carbazole structural units and to processes for the preparation thereof. The present invention furthermore relates to formulations and electronic devices which comprise these polymers.

Electronic devices which comprise organic, organometallic and/or polymeric semiconductors are increasing in importance; they are employed in many commercial products for cost reasons and owing to their performance. Examples which may be mentioned here are organic-based charge-transport materials (for example triarylamine-based hole transporters) in photocopiers, organic or polymeric light-emitting diodes (OLEDs or PLEDs) in display devices, or organic photoreceptors in photocopiers. Organic solar cells (O-SC), organic field-effect transistors (O-FET), organic thin-film transistors (O-TFT), organic integrated circuits (O-IC), organic optical amplifiers and organic laser diodes (O-lasers) are at an advanced stage of development and may achieve major importance in the future.

Irrespective of the particular application, many of these electronic devices have the following general layer structure, which can be adapted for the particular application:
(1) substrate,
(2) electrode, frequently metallic or inorganic, but also made from organic or polymeric conductive materials,
(3) charge-injection layer(s) or interlayer(s), for example for compensation of electrode unevenness ("planarisation layer"), frequently made from a conductive, doped polymer,
(4) organic semiconductors,
(5) optionally further charge-transport, charge-injection or charge-blocking layers,
(6) counterelectrode, materials as mentioned under (2),
(7) encapsulation.

The above arrangement represents the general structure of an organic electronic device, where various layers can be combined, resulting in the simplest case in an arrangement comprising two electrodes, between which an organic layer is located. In this case, the organic layer fulfils all functions, including the emission of light in the case of OLEDs. A system of this type is described, for example, in WO 90/13148 A1 based on poly-(p-phenylenes).

However, a problem which arises in a "three-layer system" of this type is the lack of control of charge separation or the lack of a way of optimising the properties of the individual constituents in different layers, as is achieved in a simple manner by a multilayered structure, for example, in the case of SMOLEDs ("small-molecule OLEDs").

A small-molecule OLED often comprises one or more organic hole-injection layers, hole-transport layers, emission layers, electron-transport layers and/or electron-injection layers and an anode and a cathode, where the entire system is usually located on a glass substrate. The advantage of a multilayered structure of this type consists in that various functions of charge injection, charge transport and emission can be divided in the various layers and the properties of the respective layers can thus be modified separately. This modification enables the performance of the electronic devices to be considerably improved.

Known electronic devices have a usable property profile. However, there is an ongoing necessity to improve the properties of these devices. These properties include, in particular, the lifetime of the electronic devices. A further problem is, in particular, the energy efficiency with which an electronic device achieves the specified object. In the case of organic light-emitting diodes, which may be based both on low-molecular-weight compounds and also on polymers, the light yield, in particular, should be high, meaning that as little electrical power as possible has to be consumed in order to achieve a certain light current. Furthermore, the lowest possible voltage should also be necessary in order to achieve a pre-specified luminous density.

A further object can be regarded as the provision of electronic devices having excellent performance as inexpensively as possible and in constant quality.

Furthermore, the electronic devices should be capable of being employed or adapted for many purposes. In particular, the performance of the electronic devices should be retained over a broad temperature range.

Surprisingly, it has been found that these and further objects, which are not mentioned explicitly, but can readily be derived or inferred from the connections discussed in the introduction herein, are achieved by polymers having all features of patent claim 1. Advantageous modifications of the polymers according to the invention are protected in the claims which are dependent on claim 1.

The present invention accordingly relates to a polymer containing at least one carbazole structural unit of the general formula (I)

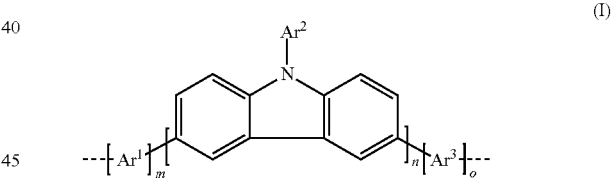

where
$Ar^1$, $Ar^2$, $Ar^3$ is each, independently of one another, an aryl or heteroaryl group, which may be substituted by one or more radicals R of any desired type;
m, o is, independently of one another, 0 or 1;
n is 1, 2 or 3 and
the dashed lines represent the linking in the polymer;
and at least one arylamine structural unit of the general formulae (II) and/or (III)

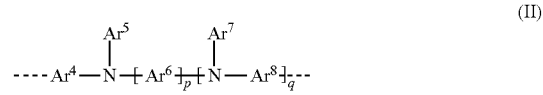

where $Ar^4$, $Ar^5$, $Ar^7$, $Ar^8$ is each, independently of one another, an aryl or heteroaryl group, which may be substituted by one or more radicals R of any desired type;

$Ar^6$ is an aryl or heteroaryl group, which may be substituted by one or more radicals R of any desired type, or represents a group of the formula $Ar^9$—Y—$Ar^9$, where $Ar^9$ is in each case, independently, an aryl or heteroaryl group, which is substituted by one or more radicals R of any desired type or which may be linked to one another, and Y is a spacer group or a direct bond;

p is 1, 2 or 3;

q is 0 or 1 and the dashed lines represent the linking in the polymer.

A BRIEF DESCRIPTION OF THE FIGURES

A DETAILED DESCRIPTION OF THE INVENTION

Figures 1, 2:
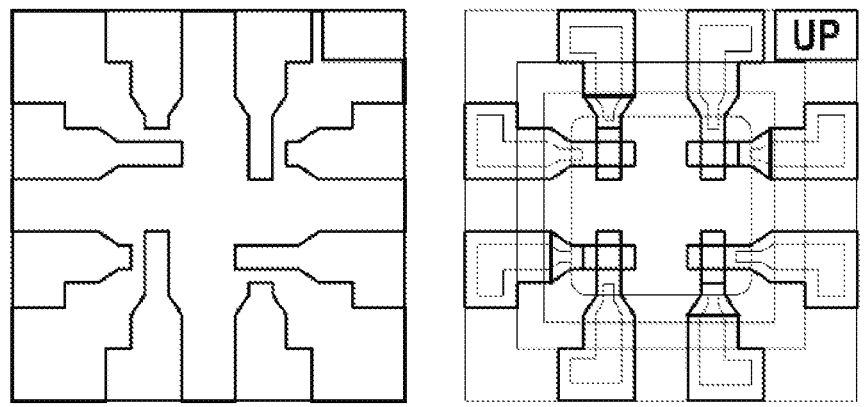
FIG. 1 depicts the structure of the typical device according to the invention.
FIG. 2 shows the structure of the device in plan view.

In the carbazole structural unit of the general formula (I), $Ar^1$, $Ar^2$ and $Ar^3$ are each, independently of one another, an aryl or heteroaryl group having to 60, preferably 5 to 40 and particularly preferably 5 to 20 ring atoms, which may be substituted by one or more radicals R of any desired type.

The arylamine structural units of the general formulae (II) and/or (III) contain the groups $Ar^4$, $Ar^5$, $Ar^7$ and $Ar^8$, each of which represent, independently of one another, an aryl or heteroaryl group having 5 to 60 ring atoms, which may be substituted by one or more radicals R of any desired type. In the formulae (II) and/or (III), the group $Ar^6$ denotes an aryl or heteroaryl group, which may be substituted by one or more radicals R of any desired type, or a group of the formula $Ar^9$—Y—$Ar^9$, where $Ar^9$ is in each case, independently, an aryl or heteroaryl group, which is substituted by one or more radicals R of any desired type or which may be linked to one another, and Y is a spacer group or a direct bond. The aryl or heteroaryl group $Ar^6$ and/or $Ar^9$ contains 5 to 60 ring atoms.

An aryl group in the sense of the present invention contains 6 to 60, preferably 6 to 40 and particularly preferably 6 to 20 C atoms, a heteroaryl group in the sense of the present invention contains 2 to 59, preferably 2 to 39 and particularly preferably 2 to 19 C atoms and at least one heteroatom, with the proviso that the sum of C atoms and heteroatoms is at least 5. The heteroatoms are preferably selected from Si, N, P, O, S and/or Se, where N, O and/or S are particularly preferred. An aryl group or heteroaryl group here is taken to mean either a simple aromatic ring, i.e. benzene, or a simple heteroaromatic ring, for example pyridine, pyrimidine and thiophene, or a condensed aryl or heteroaryl group, for example naphthalene, anthracene, phenanthrene, quinoline, isoquinoline, benzothiophene, benzofuran and indole.

For the purposes of the present invention, the radicals $Ar^1$, $Ar^2$, $Ar^3$, $Ar^4$, $Ar^5$, $Ar^6$, $Ar^7$, $Ar^8$ and $Ar^9$ in the structural units of the general formulae (I), (II) and/or (III) are particularly preferably each derived, independently of one another, from benzene, fluorene, spirobifluorene, cis- and trans-indenofluorene, naphthalene, pyridine, anthracene, phenanthrene, pyrimidine, pyrazine, pyridazine, quinoline, isoquinoline, furan, thiophene, pyrrole, benzofuran, benzothiophene and indole, where benzene, fluorene, spirobifluorene, cis- and trans-indenofluorene, naphthalene, pyridine, anthracene, phenanthrene, quinoline and isoquinoline are very particularly preferred.

In the structural units of the general formulae (I), (II) and/or (III), it is furthermore preferred for R to be selected on each occurrence, independently of one another, from F, Cl, Br, I, $N(Ar)_2$, $N(R')_2$, CN, $NO_2$, $Si(R')_3$, $B(OR')_2$, C(=O)Ar, C(=O)R', P(=O)(Ar)$_2$, P(=O)(R')$_2$, S(=O)Ar, S(=O)R', S(=O)$_2$Ar, S(=O)$_2$R', —CR'=CR'Ar, OSO$_2$R', a straight-chain alkyl, alkoxy or thioalkoxy group having 1 to 40 C atoms, preferably 1 to 20 C atoms, or a branched or cyclic alkyl, alkoxy or thioalkoxy group having 3 to 40 C atoms, preferably 3 to 20 C atoms, each of which may be substituted by one or more radicals R', where one or more non-adjacent $CH_2$ groups may be replaced by R'C=CR', C=C, $Si(R')_2$, $Ge(R')_2$, $Sn(R')_2$, C=O, C=S, C=Se, C=NR', P(=O)(R'), SO, $SO_2$, NR', O, S or CONR' and where one or more H atoms may be replaced by F, Cl, Br, I, CN or $NO_2$, a crosslinkable group or an aromatic or heteroaromatic ring system having 5 to 60 ring atoms, which may in each case be substituted by one or more radicals R', or an aryloxy or heteroaryloxy group having 5 to 60 ring atoms, which may be substituted by one or more radicals R', or a combination of these systems, where two or more substituents R may also form a mono- or polycyclic, aliphatic or aromatic ring system with one another, where R' is in each case, independently of one another, H or an aliphatic or aromatic hydrocarbon radical having 1 to 20 C atoms and Ar is an aryl or heteroaryl group having 2 to 30 C atoms.

The structural units of the general formulae (I), (II) and/or (III) may, as described above, contain one or more crosslinkable groups. "Crosslinkable group" denotes a functional group which is capable of reacting irreversibly.

A crosslinked material which is insoluble is thereby formed. The crosslinking can usually be supported by heat or by UV, microwave, X-ray or electron radiation. Due to the high stability of the polymer according to the invention, little by-product formation occurs during the crosslinking. In addition, the crosslinkable groups in the polymer according to the invention crosslink very easily, meaning that smaller amounts of energy are necessary for the crosslinking (for example <200° C. in the case of thermal crosslinking).

Examples of crosslinkable groups are units which contain a double bond, a triple bond, a precursor which is capable of in-situ formation of a double or triple bond, or a heterocyclic addition-polymerisable radical. Crosslinkable groups include, inter alia, vinyl, alkenyl, preferably ethenyl and propenyl, $C_{4-20}$-cycloalkenyl, azide, oxirane, oxetane, di(hydrocarbyl)amino, cyanate ester, hydroxyl, glycidyl ether, $C_{1-10}$-alkyl acrylate, $C_{1-10}$-alkyl methacrylate, alkenyloxy, preferably ethenyloxy, perfluoroalkenyloxy, preferably perfluoroethenyloxy, alkynyl, preferably ethynyl, maleimide, tri($C_{1-4}$)alkylsiloxy and tri($C_{1-4}$)alkylsilyl. Particular preference is given to vinyl and alkenyl.

The aryl or heteroaryl groups $Ar^4$, $Ar^5$, $Ar^6$, $Ar^7$ and $Ar^8$ are not connected to one another via a bond, meaning that units of the formula (II) or (III) do not represent a carbazole unit in the sense of the general formula (I). Units of the formula (II) are accordingly triarylamine structural units, where the structural units of the formula (III) can usually preferably form triarylamine units in combination with further structural units.

An aromatic ring system in the sense of the present contains 6 to 60, preferably 6 to 40 and particularly preferably 6 to 20 C atoms in the ring system. The heteroaromatic ring system in the sense of the present invention contains 2 to 59 preferably 2 to 39 and particularly preferably 2 to 19 C atoms and at least one heteroatom in the ring system, with the proviso that the sum of C atoms and heteroatoms is at least 5. The heteroatoms are preferably selected from Si, N, P, O, S and/or Se. An aromatic or heteroaromatic ring system in the sense of the present invention is, in addition, intended to be taken to mean a system which does not necessarily contain only aryl or heteroaryl groups, but instead in which a plurality of aryl or heteroaryl groups may also be interrupted by a non-aromatic unit (preferably less than 10% of the atoms other than H), such as, for example, an $sp^3$-hybridised C atom, an N or O atom. Thus, for example, systems such as 9,9'-spirobifluorene, 9,9-diarylfluorene, triarylamine, diaryl ethers and stilbene are also intended to be taken to be aromatic ring systems in the sense of the present invention, as are systems in which two or more aryl groups are interrupted, for example, by a linear or cyclic alkyl group or by a silyl group. P=O or C=O groups are usually not conjugation-interrupting.

An aromatic or heteroaromatic ring system having 5 to 60 ring atoms, which may also in each case be substituted by any desired radicals R and which may be linked to the aromatic or heteroaromatic ring system via any desired positions, is taken to mean, in particular, groups derived from benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, benzanthrene, benzanthracene, rubicene and triphenylene. For the purposes of the present invention, particular preference is given to fluorene, spirobifluorene, indenofluorene, anthracene, phenanthrene, dihydrophenanthrene and carbazole.

For the purposes of the present invention, an alkyl group having 1 to 40 C atoms, in which, in addition, individual H atoms or CH$_2$ groups may be substituted by the above-mentioned groups or radicals R, is preferably taken to mean the radicals methyl, ethyl, n-propyl, i-propyl, cyclopropyl, n-butyl, i-butyl, s-butyl, t-butyl, cyclobutyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl and octynyl. An alkoxy group having 1 to 40 C atoms is preferably taken to mean methoxy, trifluoromethoxy, ethoxy, n-propoxy, i-propoxy, n-butoxy, i-butoxy, s-butoxy, t-butoxy and 2-methylbutoxy.

In formula Ar$^9$—Y—Ar$^9$, Y represents a spacer group, also called a spacer. The spacer Y employed can be all groups which are known to the person skilled in the art for this purpose. The two groups Ar$^9$ may also be connected directly to one another, in this case Y represents a bond, which may be different from a spacer group.

Advantages which are surprising to the person skilled in the art can be achieved, inter alia, by spacer groups Y which effect an interruption of the conjugation of the aryl or heteroaryl groups Ar$^9$ or of the polymer.

According to a particular embodiment, Y in formula Ar$^9$—Y—Ar$^9$ is preferably a linear or branched alkylene group having 1 to 20 C atoms, particularly preferably having 1 to 12 C atoms, in which one or more non-adjacent CH$_2$ groups may be replaced by —O—, —S—, —NH—, —N(CH$_3$)—, —N—CO—, —N—CO—O—, —N—CO—N, —CO—, —O—CO—, —S—CO—, —O—COO—, —CO—S—, —CO—O—, —CH(halogen)-, —CH(CN)—, —CH=CH— or —C≡C—, or a cyclic alkyl group, preferably cyclohexane or a cyclohexane derivative with 1,4- or 1,3-linking. Further possible spacer groups Y are, for example, —(CH$_2$)$_o$—, —(CH$_2$CH$_2$O)$_p$—CH$_2$CH$_2$—, —CH$_2$CH$_2$—S—CH$_2$CH$_2$— or —CH$_2$CH$_2$—NH—CH$_2$CH$_2$—, where o=1 to 12, preferably 2 to 12, and p=1 to 3, but also —O—.

Particularly preferred spacer groups Y are methylene, ethylene, propylene, butylene, pentylene, hexylene, heptylene, octylene, nonylene, decylene, undecylene, dodecylene, octadecylene, ethyleneoxyethylene, methyleneoxybutylene, ethylenethioethylene, ethylene-N-methyliminoethylene, 1-methylalkylene, ethenylene, propenylene and butenylene.

It is particularly preferred for Y to denote an alkylene or alkyleneoxy group having 2 to 8 C atoms. Straight-chain groups are particularly preferred here.

According to a further embodiment, the spacer group Y in formula Ar$^9$—Y—Ar$^9$ may contain aromatic or heteroaromatic ring systems. Particular preference is given here to spacer groups of the formula (Ya)

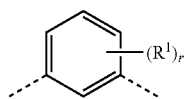

(Ya)

where

R$^1$ is in each case, independently of one another, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF$_3$ group, Cl, Br, F, a crosslinkable group or a substituted or unsubstituted aromatic or heteroaromatic ring system having 5 to 60 ring atoms, or an aryloxy or heteroaryloxy group having 5 to 60 ring atoms, or a combination of these systems, where one or more of the groups R$^1$ may form a mono- or polycyclic, aliphatic or aromatic ring system with one another and/or with the ring to which the group $R^1$ is bonded;

r is 0, 1, 2, 3 or 4 and the dashed lines represent the links to the aryl or heteroaryl groups $Ar^9$.

Units of the formula $Ar^9$—Y—$Ar^9$ may preferably contain at least one spacer group Y of the formula (Yb)

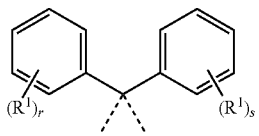

(Yb)

where $R^1$ is in each case, independently of one another, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF$_3$ group, Cl, Br, F, a crosslinkable group or a substituted or unsubstituted aromatic or heteroaromatic ring system having 5 to 60 ring atoms, or an aryloxy or heteroaryloxy group having 5 to 60 ring atoms, or a combination of these systems, where one or more of the groups $R^1$ may form a mono- or polycyclic, aliphatic or aromatic ring system with one another and/or with the ring to which the group $R^1$ is bonded;

r, s, is, independently of one another, 0, 1, 2, 3 or 4 and the dashed lines represent the links to the aryl or heteroaryl groups $Ar^9$.

Units of the formula $Ar^9$—Y—$Ar^9$ may particularly preferably contain at least one spacer group Y of the formula (Yb1)

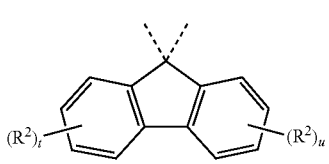

(Yb1)

where $R^2$ is in each case, independently, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF$_3$ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups $R^2$ may form a mono- or polycyclic, aliphatic or aromatic ring system with one another and/or with the ring to which the group $R^2$ is bonded;

t, u, is, independently of one another, 0, 1, 2, 3 or 4 and the dashed lines represent the links to the aryl or heteroaryl groups $Ar^9$.

Particularly surprising advantages are exhibited, in particular, by units of the formula $Ar^9$—Y—$Ar^9$ which contain at least one spacer group Y of the formula (Yb2)

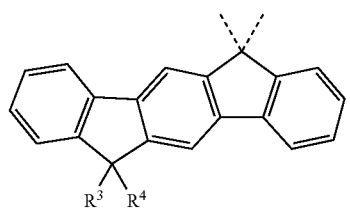

(Yb2)

where $R^3$, $R^4$ is each, independently of one another, a hydrogen atom, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF$_3$ group, Cl, Br, F, a crosslinkable group or a substituted or unsubstituted aromatic or heteroaromatic ring system having 5 to 60 ring atoms, or an aryloxy or heteroaryloxy group having 5 to 60 ring atoms, or a combination of these systems, where one or more of the groups $R^3$, $R^4$ may form a mono- or polycyclic, aliphatic or aromatic ring system with one another and/or with another ring and the dashed lines represent the links to the aryl or heteroaryl groups $Ar^9$.

According to a preferred embodiment of the present invention, a polymer according to the invention contains at least one carbazole structural unit of the general formula (Ia)

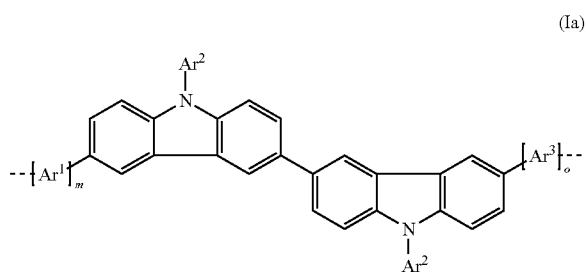

(Ia)

where $Ar^1$, $Ar^2$, $Ar^3$ is each, independently of one another, an aryl or heteroaryl group, which may be substituted by one or more radicals R of any desired type;

m, o is, independently of one another, 0 or 1 and
the dashed lines represent the linking in the polymer.

The radicals $Ar^1$, $Ar^2$, $Ar^3$ and the indices m and o in formula (Ia) have the meaning indicated above for formula (I).

Particularly preferred polymers contain at least one carbazole structural unit of the general formula (Ib)

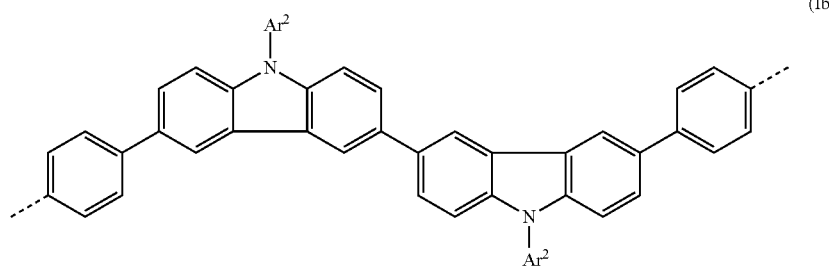

(Ib)

where
$Ar^2$ is in each case, independently of one another, an aryl or heteroaryl group, which may be substituted by one or more radicals R of any desired type, and
the dashed lines represent the linking in the polymer.

The radical $Ar^2$ in formula (Ib) has the meaning indicated above for formula (I).

The proportion of carbazole structural unit of the general formula (I), (Ia) and (Ib) in the polymer according to the invention is, according to a preferred embodiment of the present invention, at least 5 mol %, particularly preferably at least 10 mol %, very particularly preferably at least 20 mol % and in particular at least 40 mol %.

Surprising advantages can be achieved with polymers according to the invention which preferably contain at least one arylamine structural unit of the general formula (IIa) and/or (IIIa)

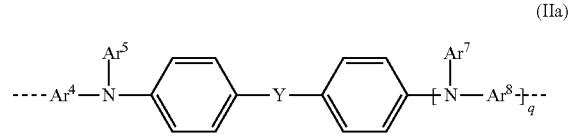

(IIa)

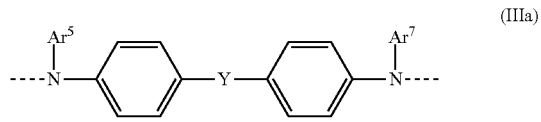

(IIIa)

where
$Ar^4$, $Ar^5$, $Ar^7$, $Ar^8$ is each, independently of one another, an aryl or heteroaryl group, which may be substituted by one or more radicals R of any desired type;
q is 0 or 1, preferably 1;
Y is a spacer group or a direct bond and
the dashed lines represent the linking in the polymer.

In the formulae (IIa) and/or (IIIa), the radicals $Ar^4$, $Ar^5$, $Ar^7$, $Ar^8$, the index q and the spacer group Y have the meaning indicated above for the formulae (II) and/or (III). The spacer group Y can preferably effect an interruption of the conjugation of the aryl groups or of the polymer, as described in detail above.

Preference is furthermore given to polymers which contain at least one arylamine structural unit of the general formula (IIIb)

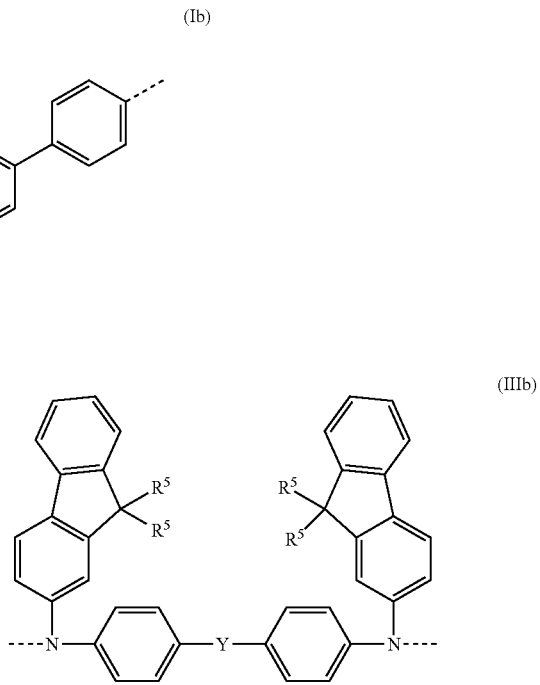

(IIIb)

where
Y is a spacer group or a direct bond;
$R^5$ is in each case, independently, a hydrogen atom, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a $CF_3$ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups $R^5$ may form a mono- or polycyclic, aliphatic or aromatic ring system with one another and/or with the ring to which the group $R^5$ is bonded,
and the dashed lines represent the linking in the polymer.

The proportion of arylamine structural units of the general formulae (II), (IIa), (III), (IIIa) and (IIIb) in the polymer according to the invention is, according to a preferred embodiments of the present invention, at least 5 mol %, particularly preferably at least 10 mol %, very particularly preferably at least 20 mol % and in particular at least 40 mol %.

The molar ratio of carbazole structural units of the general formulae (I), (Ia) and (Ib) to arylamine structural units of the general formulae (II), (IIa), (III), (IIIa) and (IIIb) is preferably in the range from 10:1 to 1:10, particularly preferably in the range from 5:1 to 1:5 and very particularly preferably in the range from 2:1 to 1:2.

Besides one or more structural units of the general formulae (I), (II) and/or (III), the polymers according to the invention may also contain further structural units.

Advantages which are surprising to the person skilled in the art can be achieved, inter alia, by polymers which contain connecting structural units. Particularly preferred connecting structural units can effect an interruption of the conjugation of the polymer.

Preferred connecting structural units conform to the formula (IV)

(IV)

where
X is a spacer group and
the dashed lines represent the linking in the polymer.

The preferred spacer groups X include, inter alia, linear or branched alkylene groups having 1 to 20 C atoms, particularly preferably having 1 to 12 C atoms, in which one or more non-adjacent CH$_2$ groups may be replaced by —O—, —S—, —NH—, —N(CH$_3$)—, —N—CO—, —N—CO—O—, —N—CO—N, —CO—, —O—CO—, —S—CO—, —O—COO—, —CO—S—, —CO—O—, —CH(halogen)-, —CH(CN)—, —CH═CH— or —C≡C—, or cyclic alkyl groups, preferably cyclohexane or a cyclohexane derivative with 1,4- or 1,3-linking. Further possible spacer groups X are, for example, —(CH$_2$)$_o$—, —(CH$_2$CH$_2$O)$_p$—CH$_2$CH$_2$—, —CH$_2$CH$_2$—S—CH$_2$CH$_2$— or —CH$_2$CH$_2$—NH—CH$_2$CH$_2$—, where o=1 to 12, preferably 2 to 12, and p=1 to 3, but also —O—.

Particularly preferred spacer groups X are methylene, ethylene, propylene, butylene, pentylene, hexylene, heptylene, octylene, nonylene, decylene, undecylene, dodecylene, octadecylene, ethyleneoxyethylene, methyleneoxybutylene, ethylenethioethylene, ethylene-N-methyliminoethylene, 1-methylalkylene, ethenylene, propenylene and butenylene.

In particular, X denotes an alkylene or alkyleneoxy group having 2 to 8 C atoms. Straight-chain groups are particularly preferred here.

According to a further embodiment, the connecting structural unit may contain aromatic or heteroaromatic ring systems. Particular preference is given here to connecting structural units of the formula (Va)

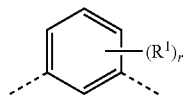

(Va)

where
R$^1$ is in each case, independently of one another, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(═O)NH$_2$), a haloformyl group (—C(═O)—X, in which X represents a halogen atom), a formyl group (—C(═O)—H), an isocyano group, an isocyanate group, a thiocyanate group or a thioisocyanate group, an amino group, a hydroxyl group, a nitro group, a CF$_3$ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups R$^1$ may form a mono- or polycyclic, aliphatic or aromatic ring system with one another and/or with the ring to which the group R$^1$ is bonded;

r is 0, 1, 2, 3 or 4 and
the dashed lines represent the linking in the polymer.

Furthermore, use can preferably be made of connecting structural units of the formula (Vb)

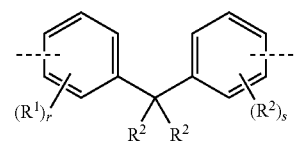

(Vb)

where
R$^1$, R$^2$ is each, independently of one another, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(═O)NH$_2$), a haloformyl group (—C(═O)—X, in which X represents a halogen atom), a formyl group (—C(═O)—H), an isocyano group, an isocyanate group, a thiocyanate group or a thioisocyanate group, an amino group, a hydroxyl group, a nitro group, a CF$_3$ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups R$^1$ and/or R$^2$ may form a mono- or polycyclic, aliphatic or aromatic ring system with one another and/or with the ring to which the group R$^1$ is bonded;

r, s is, independently of one another, 0, 1, 2, 3 or 4 and
the dashed lines represent the linking in the polymer.

Particularly preferred polymers contain at least one connecting structural unit of the formula (Vb1)

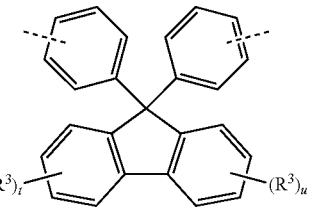

(Vb1)

where
R$^3$ is in each case, independently of one another, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF$_3$ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups R$^3$ may form a mono- or polycyclic, aliphatic or aromatic ring system with one another and/or with the ring to which the group R$^3$ is bonded;

t, u is, independently of one another, 0, 1, 2, 3 or 4 and the dashed lines represent the linking in the polymer.

Particularly surprising advantages are exhibited, in particular, by polymers which contain at least one connecting structural unit of the formula (Vb2)

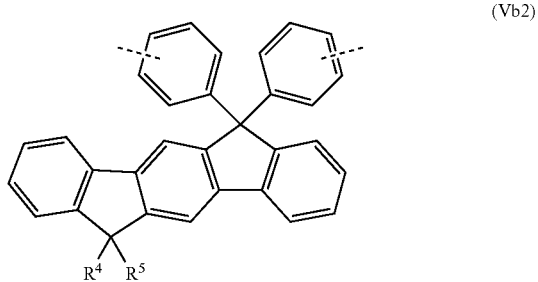

(Vb2)

where

R$^4$, R$^5$ is each, independently of one another, a hydrogen atom, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group a nitro group, a CF$_3$ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups R$^4$, R$^5$ may form a mono- or polycyclic, aliphatic or aromatic ring system with one another and/or with another ring and the dashed lines represent the linking in the polymer.

The proportion of connecting structural units, in particular those of the above formulae (IV), (Va), (Vb), (Vb1) and (Vb2), in the polymer according to the invention is, according to a preferred embodiments of the present invention, in the range from 0 to 90 mol %, particularly preferably in the range from 1 to 50 mol % and very particularly preferably in the range from 0 to 30 mol %.

The molar ratio of carbazole structural units of the general formulae (I), (Ia) and (Ib) to connecting structural units, in particular those of the above formulae (IV), (Va), (Vb), (Vb1) and (Vb2), is preferably in the range from 100:1 to 1:10, particularly preferably in the range from 50:1 to 1:5 and very particularly preferably in the range from 20:1 to 1:2, if connecting structural units are present in the polymer.

According to a further preferred embodiment, the molar ratio of arylamine structural units of the general formulae (II), (IIa), (III), (IIIa) and (IIIb) to connecting structural units, in particular those of above formulae (IV), (Va), (Vb), (Vb1) and (Vb2), is preferably in the range from 100:1 to 1:10, particularly preferably in the range from 50:1 to 1:5 and very particularly preferably in the range from 20:1 to 1:2, if connecting structural units are present in the polymer.

A polymer in the sense of the present invention is also intended to be taken to mean an oligomer and a dendrimer.

An oligomer in the sense of the present invention is the term applied to a compound which has three to nine recurring units. A polymer in the sense of the present invention is taken to mean a compound which has ten or more recurring units. The branching factor of the polymers here is between 0 (linear polymer, no branching points) and 1 (fully branched dendrimer).

The polymers, oligomers or dendrimers may be conjugated, partially conjugated or non-conjugated. The polymers or oligomers may be linear, branched or dendritic. In the structures linked in a linear manner, the units of the general formulae (I), (II) and/or (III) may be both linked directly to one another or they may be linked to one another via a divalent group, for example via a substituted or unsubstituted alkylene group, via a heteroatom or via a divalent aromatic or heteroaromatic group. In branched structures, for example, three or more units of the general formulae (I), (II) and/or (III) may be linked via a trivalent or polyvalent group, for example via a trivalent or polyvalent aromatic or heteroaromatic group, to form a branched polymer or oligomer.

The polymers of the present invention preferably have a weight average molecular weight M$_w$ in the range from 10000 to 2000000 g/mol, particularly preferably in the range from 20000 to 1000000 g/mol and very particularly preferably in the range from 50000 to 500000 g/mol. The weight average molecular weight M$_w$ can be determined by conventional methods, in particular by gel permeation chromatography (GPC).

The polymers according to the invention are prepared using known methods, where functionalised compounds are copolymerised. These functionalised compounds contain the structural units of the above formulae described above and at least two leaving groups, such as bromine, iodine, boronic acid or boronic acid ester.

Suitable polymerisation reactions are known to the person skilled in the art and described in the literature. Particularly suitable and preferred polymerisation and coupling reactions, all of which result in C—C links, are those according to SUZUKI, YAMAMOTO, STILLE, HECK, NEGISHI, SONOGASHIRA or HIYAMA. The C—C linking reactions are particularly preferably carried out via a SUZUKI coupling.

Surprising advantages can be achieved, in particular, by polymers which are obtained by a BUCHWALD reaction. Here, an aromatic diamine is reacted with an aryl halide. Preferred functional monomers which can be reacted using the BUCHWALD reaction are, in particular, halides which contain carbazole structural units of the formula (I), (Ia) or (Ib) and diamines having two secondary nitrogen atoms which contain structural units of the formula (III), (IIIa) or (IIIb).

Accordingly, preferred carbazole monomers for the preparation of the polymers according to the invention conform to the formulae (M I), (M Ia) and (M Ib)

Particular preference is furthermore given to the use of arylamine monomers of the formula (M III), (M IIIa) and (M IIIb)

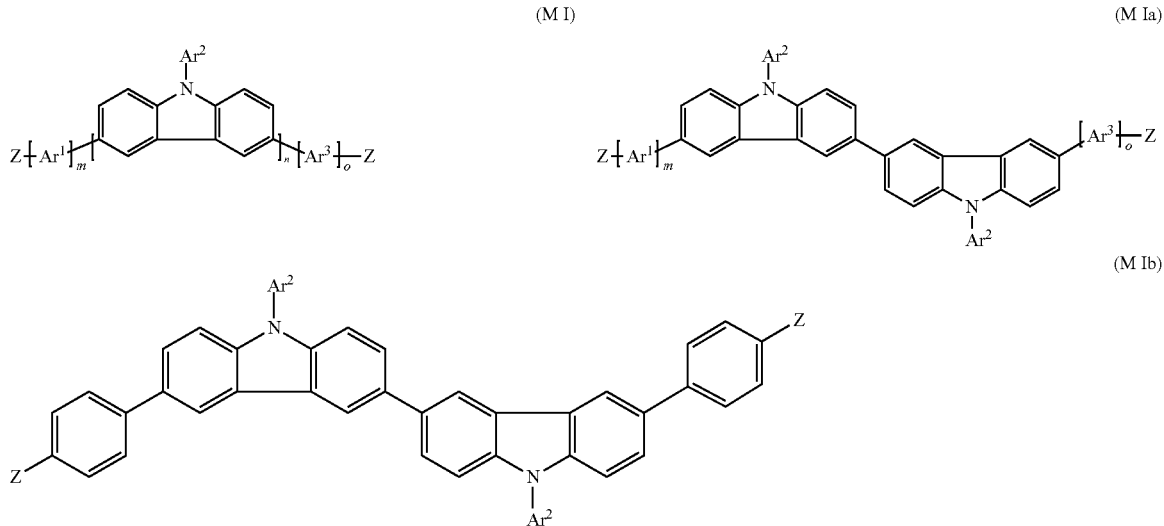

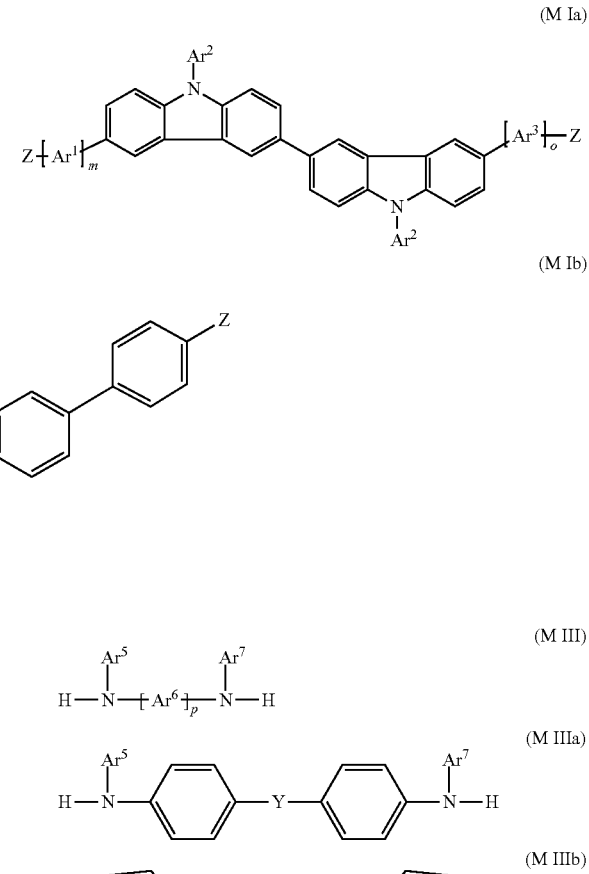

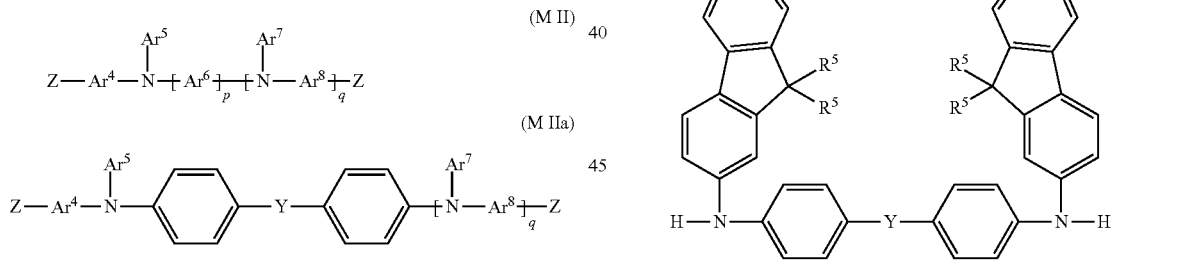

where
Ar$^1$, Ar$^2$, Ar$^3$ is each, independently of one another, an aryl or heteroaryl group, which may be substituted by one or more radicals R of any desired type;
m, o is, independently of one another, 0 or 1;
n is 1, 2 or 3 and
Z is in each case, independently, a leaving group.

Preferred arylamine monomers for the preparation of the polymers according to the invention conform to the formulae (M II) and (M IIa)

where
Ar$^4$, Ar$^5$, Ar$^7$, Ar$^8$ is each, independently of one another, an aryl or heteroaryl group, which may be substituted by one or more radicals R of any desired type;
Ar$^6$ is an aryl or heteroaryl group, which may be substituted by one or more radicals R of any desired type, or represents a group of the formula Ar$^9$—Y—Ar$^9$, where Ar$^9$ is in each case, independently, an aryl or heteroaryl group, which is substituted by one or more radicals R of any desired type or which may be linked to one another;
Y is a spacer group or a direct bond;
p is 1, 2 or 3;
q is 0 or 1 and
Z is in each case, independently, a leaving group.

The arylamine monomers of the formulae (M II) and (M IIa) can be polymerised with the carbazole monomers described above, in particular by the SUZUKI reaction described above.

where
Ar$^5$, Ar$^7$ is each, independently of one another, an aryl or heteroaryl group, which may be substituted by one or more radicals R of any desired type;
Ar$^6$ is an aryl or heteroaryl group, which may be substituted by one or more radicals R of any desired type, or represents a group of the formula Ar$^9$—Y—Ar$^9$, where Ar$^9$ is in each case, independently of one another, an aryl or heteroaryl group, which is substituted by one or more radicals R of any desired type or which may be linked to one another, and
Y is a spacer group or a direct bond;
R$^5$ is in each case, independently of one another, a hydrogen atom, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF$_3$ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups R$^5$ may form a mono- or polycyclic, aliphatic or aromatic ring system with one another and/or with one another, and p is 1, 2 or 3.

The arylamine monomers of the formulae (M III), (M IIIa) and (M IIIb) can be reacted with the carbazole monomers, in particular by the BUCHWALD reaction described above.

The particularly preferred comonomers which can be employed for the insertion of connecting structural units, in particular of the formulae (IV), (Va) and (Vb), include, inter alia, compounds having two leaving groups, such as bromine, iodine, boronic acid or boronic acid esters, which contain the said structural units.

In addition, the polymer according to the invention may contain further recurring units derived from functional comonomers.

Furthermore, the composition for the preparation of the polymers according to the invention may comprise further reactive compounds, in particular monofunctional compounds, with which control of the molecular weight is possible. These compounds correspond to the monomers described above, but, instead of two or more leaving groups, have just one leaving group, preferably bromine, iodine, a boronic acid or boronic acid ester group. In the case of the Buchwald reaction, monofunctional amines may also be used.

The way in which the polymerisation can be carried out by these methods and the way in which the polymers can then be separated off from the reaction medium and purified is known to the person skilled in the art and described in detail in the literature, for example in WO 03/048225 and WO 04/037887.

Polymers, oligomers or dendrimers which contain the structural units according to the invention are used, for example, for the production of OLEDs or PLEDs, preferably in the emitter layer, in particular as host material, in the hole-injection layer and/or in the hole-transport layer.

The polymer layer can be produced, for example, by coating from solution, preferably spin coating.

The present invention also relates to the use of the polymers, oligomers or dendrimers according to the invention in an organic, electronic device.

The organic, electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

For the purposes of the present invention, it is preferred for the polymer, oligomer or dendrimer according to the invention to be in the form of a layer (or to be present in a layer) in the electronic device.

The present invention thus also relates to a layer, in particular an organic layer, comprising one or more polymers, oligomers or dendrimers according to the invention, as defined above.

The polymers and copolymers may furthermore be linear or branched. The copolymers according to the invention may have random, alternating or block-like structures or have a plurality of these structures in an alternating arrangement. The way in which copolymers having block-like structures can be obtained and which further structural elements are particularly preferred for this purpose are described in detail, for example, in WO 05/014688. This specification is incorporated into the present application by way of reference.

In a further embodiment of the present invention, the device encompasses a plurality of layers. The polymer, oligomer or dendrimer according to the invention is preferably present here in a hole-transport, hole-injection and/or emitter layer.

The present invention accordingly also relates to an electronic device which comprises at least one hole-transport and/or hole-injection layer comprising a polymer according to the invention. The thickness of the hole-transport and/or hole-injection layer is preferably in the range from 1 to 500 nm, particularly preferably in the range from 2 to 200 nm.

The device may furthermore comprise layers which are built up from low-molecular-weight compounds (so-called small molecules; SMOLED. These can be produced by evaporation of the low-molecular-weight compounds in a high vacuum.

It may additionally be preferred to use the polymer not as the pure substance, but instead as a mixture (blend) together with further polymeric, oligomeric, dendritic or low-molecular-weight substances of any desired type. These may, for example, improve the electronic properties or emit themselves. The present invention therefore likewise relates to blends of this type.

In a preferred embodiment of the present invention, the polymers, oligomers or dendrimers according to the invention are employed as host materials or matrix material in an emitting layer. The organic electroluminescent device here may comprise one emitting layer or a plurality of emitting layers, where at least one emitting layer comprises at least one polymer, oligomer or dendrimer according to the invention, as defined above. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Very particular preference is given to three-layer systems, where the three layers exhibit blue, green and orange or red emission (for the basic structure see, for example, WO 05/011013). White-emitting devices are suitable, for example, as lighting or backlighting of displays (LCDs).

Apart from these layers, the organic electroluminescent device may also comprise further layers, for example in each case one or more hole-injection layers, hole-transport layers, hole-blocking layers, electron-transport layers, electron-injection layers, exciton-blocking layers and/or charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*). Likewise, interlayers which have, for example, an exciton-blocking function may be introduced between two emitting layers. However, it should be pointed out that each of these layers does not necessarily have to be present. These layers may likewise comprise the polymers, oligomers or dendrimers according to the invention, as defined above. It is also possible for a plurality of OLEDs to be arranged one above the other, enabling a further increase in efficiency with respect to the light yield to be achieved. In order to improve the coupling-out of light, the final organic layer on the light-exit side in OLEDs can, for example, also be in the form of a nano-foam, resulting in a reduction in the proportion of total reflection.

Preference is furthermore given to an organic electroluminescent device in which one or more layers are applied by means of a sublimation process, in which the materials are applied by vapour deposition in vacuum sublimation units at a pressure below $10^{-5}$ mbar, preferably below $10^{-6}$ mbar, particularly preferably below $10^{-7}$ mbar.

Preference is likewise given to an organic electroluminescent device which is characterised in that one or more layers are applied by means of the OVPD (organic vapour phase deposition) process or with the aid of carrier-gas sublimation, in which the materials are applied at a pressure between $10^{-5}$ mbar and 1 bar.

Preference is furthermore given to an organic electroluminescent device which is characterised in that one or more layers are applied from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds, which are obtained, if necessary, by suitable substitution, are necessary for this purpose.

Correspondingly, the present invention furthermore relates to a formulation comprising a polymer, oligomer or dendrimer according to the invention, as defined above, which has structural units of the general formulae (I), (II) and/or (III), in one or more solvents. The way in which formulations of this type can be prepared is known to the person skilled in the art and is described, for example, in WO 02/072714, WO 03/019694 and the literature cited therein.

Suitable and preferred solvents are, for example, toluene, anisole, xylenes, methyl benzoate, dimethylanisoles, mesitylenes, tetralin, veratrol, tetrahydrofuran and chlorobenzene, and mixtures thereof.

The device usually comprises a cathode and an anode (electrodes). The electrodes (cathode, anode) are selected for the purposes of the present invention in such a way that their potential corresponds as closely as possible to the potential of the adjacent, organic layer in order to ensure highly efficient electron or hole injection.

The cathode preferably comprises metal complexes, metals having a low work function, metal alloys or multilayered structures comprising various metals, such as, for example, alkaline-earth metals, alkali metals, main-group metals or lanthanoids (for example Ca, Ba, Mg, Al, In, Mg, Yb and Sm). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali-metal or alkaline-earth metal fluorides, but also the corresponding oxides (for example LiF, $Li_2O$, $BaF_2$, MgO and NaF). The layer thickness of this layer is preferably between 1 and 10 nm, particularly preferably between 2 and 8 nm.

The anode preferably comprises materials having a high work function. The anode preferably has a potential greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. For some applications, at least one of the electrodes must be transparent in order to facilitate either irradiation of the organic material (O-SC) or the coupling-out of light (OLED/PLED, O-LASER). A preferred structure uses a transparent anode. Preferred anode materials here are conductive, mixed metal oxides. Particular preference is given to indium tin oxide (ITO) or indium zinc oxide (IZO). Preference is furthermore given to conductive, doped organic materials, in particular conductive, doped polymers, such as, for example, poly(ethylenedioxythiophene) (PEDOT) and polyaniline (PANI).

The device is correspondingly structured, provided with contacts and finally hermetically sealed in a manner known per se, depending on the application, since the lifetime of such devices is drastically shortened in the presence of water and/or air.

The invention is explained in greater detail below with reference to working examples, but without being restricted thereby.

WORKING EXAMPLES

A) Preparation of the Monomers

Example 1

Preparation of Compound 3

Compound 3 is prepared as follows:

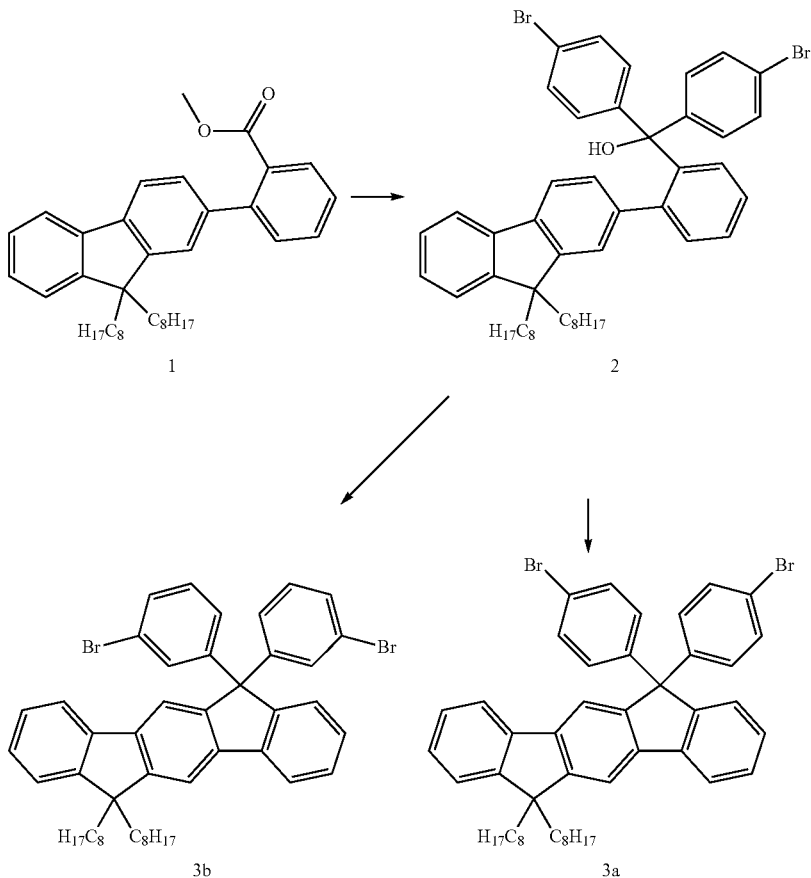

Compound 2

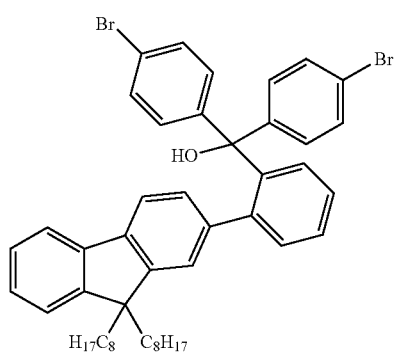

104.3 g (2 molar equivalents, 0.442 mol) of 1,4-dibromobenzene are initially introduced in 300 ml of THF and cooled to −75° C. in an acetone/dry-ice bath. 117 ml (2 molar equivalents, 0.442 mol) of n-butyllithium (2.5 M in hexane) are added dropwise at such a rate that the internal temperature does not exceed −69° C., stirring is subsequently continued at −72° C. for 1 hour. 116 g (1 molar equivalent, 0.221 mol) of compound 1 are then dissolved in 220 ml of THF and slowly added dropwise at −72° C. that the internal temperature does not exceed −69° C. The reaction solution is stirred at −70° C. for a further hour and at room temperature overnight. 120 ml of 50% acetic acid are added to the batch. The phases are separated. The aqueous phase is extracted with heptane. The combined organic phases are extracted with water, dried over $Na_2SO_4$, filtered and evaporated under reduced pressure.

$^1$H NMR (CDCl$_2$, δ (ppm), J (Hz)): 0.51 (s broad, 4H), 0.81 (t, 6H, J=7.25), 0.94-1.25 (m, 20H), 1.55-1.85 (m, 4H), 6.73 (d, 1H, J=8.0), 6.87-6.90 (m, 2H), 6.95-7.05 (m broad, 4H), 7.21 (d, 1H, J=7.55), 7.24 (d, 1H, J=7.75), 7.28-7.36 (m, 4H), 7.42 (d, 4H, J=8.6), 7.56 (d, 1H, 7.75), 7.66-7.68 (m, 1H)
Compound 3a

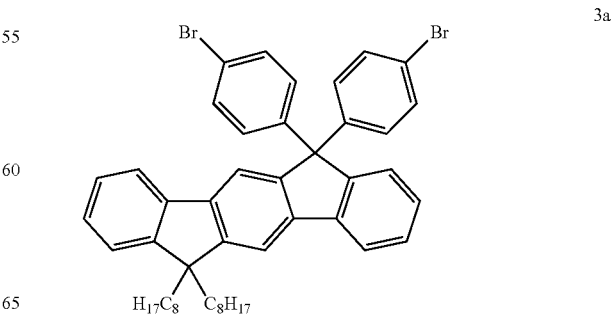

177.4 g (1 molar equivalent, 0.22 mol) of compound 2 are dissolved in 353.2 ml (2.8 molar equivalents, 6.1 mol) of acetic acid and warmed to reflux. 19.6 ml (1.1 molar equivalents, 0.24 mol) of concentrated hydrochloric acid are added under reflux, and the mixture is heated under reflux for 1.5 hours. After a TLC check (heptane/ethyl acetate), 2×2 ml of concentrated hydrochloric acid are added, reaction time 3 hours. When the reaction is complete, 25 ml of water is carefully added. A further 50 ml of water is subsequently added for phase separation. The mixture is extracted with dichloromethane, the combined organic phases are then extracted with water and NaHCO$_3$, dried over sodium sulfate, filtered and evaporated under reduced pressure.

The purification is carried out by recrystallisation (acetonitrile/toluene) and gives a white solid (99%).

$^1$H NMR (CDCl$_2$, δ (ppm), J (Hz)): 0.65-0.75 (m, 4H), 0.79 (t, 6H, J=7.25), 0.99-1.25 (m, 20H), 1.98-2.01 (m, 4H), 7.10 (d, 4H, J=8.75), 7.26-7.29 (m, 3H), 7.33-7.41 (m, 7H), 7.57 (s, 1H), 7.60-7.62 (m, 1H), 7.71 (s, 1H), 7.84 (d, 1H, 7.55)

Compound 3b

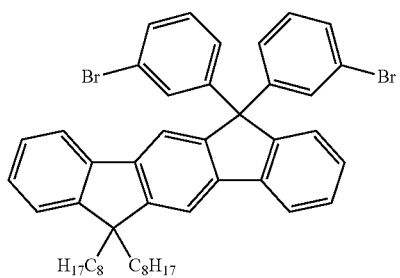

3b

Compound 3b is prepared analogously to compound 3a using 1,3-dibromobenzene as commercial starting material.

$^1$H NMR (CDCl$_2$, δ (ppm), J (Hz)): 0.65-0.75 (m, 4H), 0.79 (t, 6H, J=7.25), 0.99-1.25 (m, 20H), 1.98-2.01 (m, 4H), 7.10 (d, 4H, J=8.75), 7.26-7.29 (m, 3H), 7.33-7.41 (m, 7H), 7.57 (s, 1H), 7.60-7.62 (m, 1H), 7.71 (s, 1H), 7.84 (d, 1H, 7.55)

Example 2

Preparation of Compound 6

Compound 6 is prepared as follows:

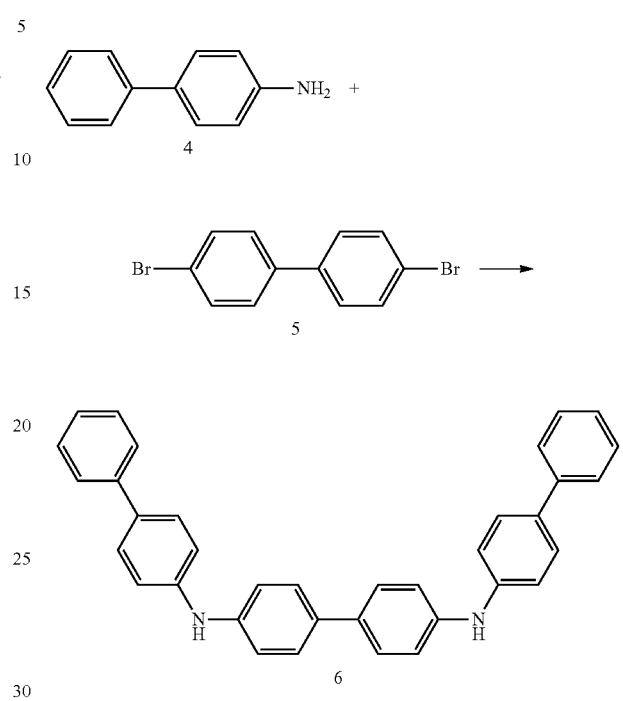

25 g of 4-aminobiphenyl 4 (148 mmol), 22.6 g (72 mmol) of 4,4'-dibromobiphenyl 5 and 21.4 g of sodium tert-butoxide (222 mmol) are dissolved in toluene, and the reaction solution is carefully degassed. The reaction solution is warmed to 80° C., and the reaction is initiated by addition of the catalyst 325 mg (0.36 mmol) of Pd$_2$dba$_3$ and 451 mg (0.73 mmol) of BINAP and heated to the reflux temperature. The progress of the reaction is followed by means of thin-layer chromatography. When the reaction is complete, the mixture is cooled to room temperature, and 50 ml of water are added. The phases are separated, the aqueous phase is extracted twice with 50 ml of toluene. The combined organic phases are washed three times with 50 ml of water, dried over magnesium sulfate, and the solvent is stripped off in vacuo. The crude product is recrystallised from toluene.

Examples 3 to 5

Preparation of Compounds 11 to 13

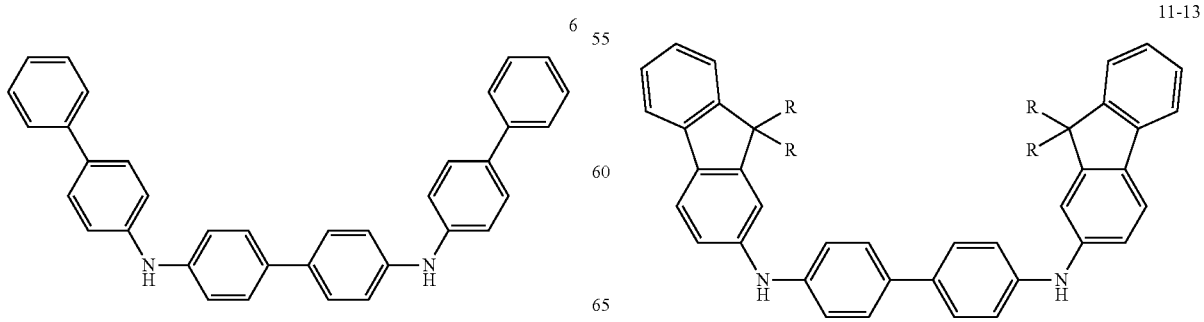

Compounds 11 to 13 are prepared as follows:

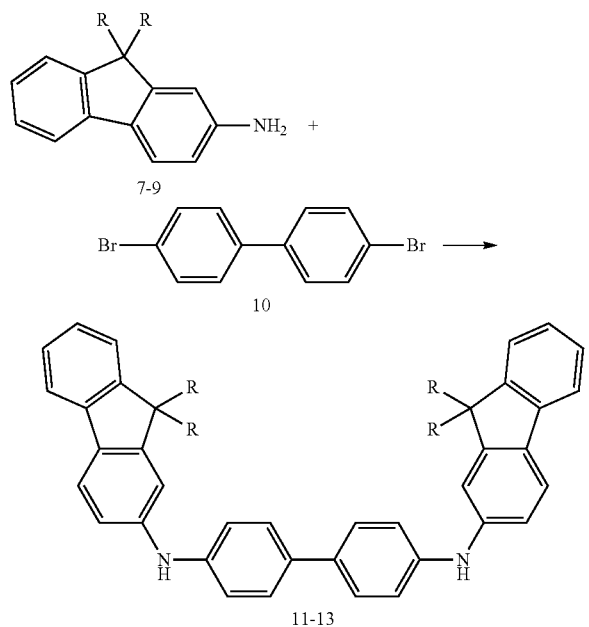

The N,N'-dialkyldifluorenebenzidines 11 to 13 are obtained analogously to the synthesis of dibiphenylbenzidine (see Example 2).
N,N'-bis(dimethylfluorene)benzidine 11
N,N'-bis(dibutylfluorene)benzidine 12
N,N'-bis(dioctylfluorene)benzidine 13

Examples 6 to 8

Preparation of Compounds 15 to 17

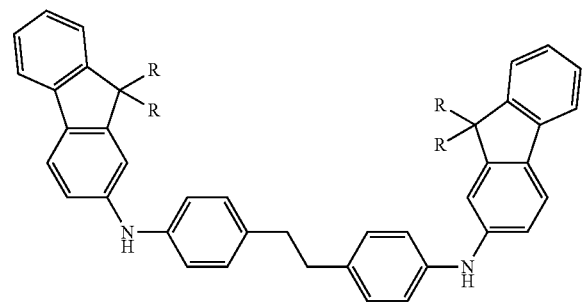

Compounds 15 to 17 are prepared as follows:

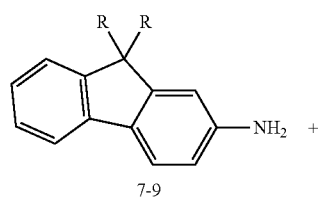

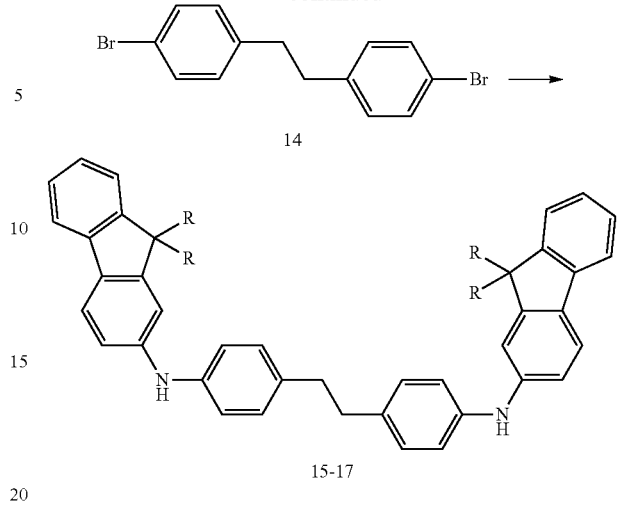

13.9 g of 4-aminodimethylfluorene 7 (66 mmol), 11 g (32 mmol) of 4,4'dibromobibenzyl 14 and 9.4 g of sodium tert-butoxide (97 mmol) are dissolved in toluene, and the reaction solution is carefully degassed. The reaction solution is warmed to 80° C., and the reaction is initiated by addition of the catalyst 148 mg (0.16 mmol) of $Pd_2dba_3$ and 201 mg (0.32 mmol) of BINAP and heated to the reflux temperature. The progress of the reaction is followed by means of thin-layer chromatography. When the reaction is complete, the mixture is cooled to room temperature, and 30 ml of water are added. The phases are separated, the aqueous phase is extracted twice with 30 ml of toluene. The combined organic phases are washed three times with 30 ml of water, dried over magnesium sulfate ($MgSO_4$), and the solvent is stripped off in vacuo. The crude product is recrystallised from toluene.

The N,N'-bis(dialkylfluorene)diaminobibenzyls 15 to 17 are obtained analogously to the synthesis of dibiphenylbenzidine (see Example 2).
N,N'-bis(dimethylfluorene)diaminobibenzyl 15
N,N'-bis(dibutylfluorene)diaminobibenzyl 16
N,N'-bis(dioctylfluorene)diaminobibenzyl 17

Example 9

Preparation of Compound 23

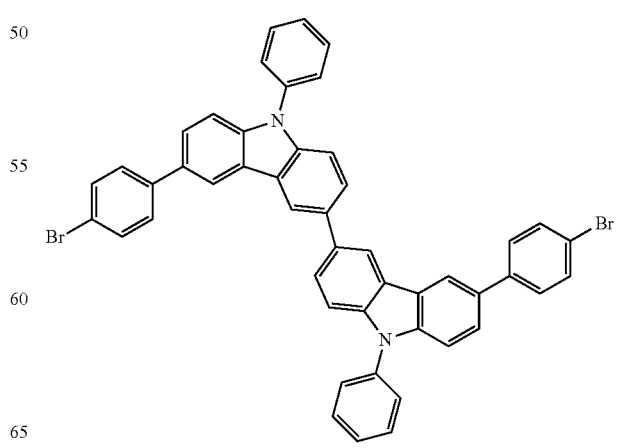

Compound 23 is obtained in accordance with the following synthesis sequence:
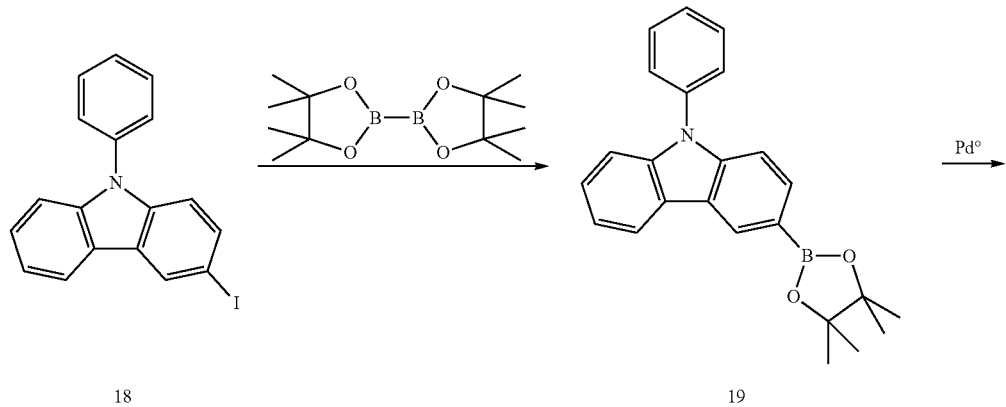
18 → 19
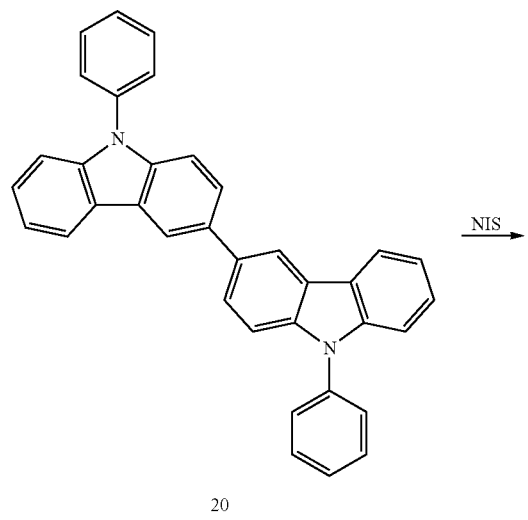
20
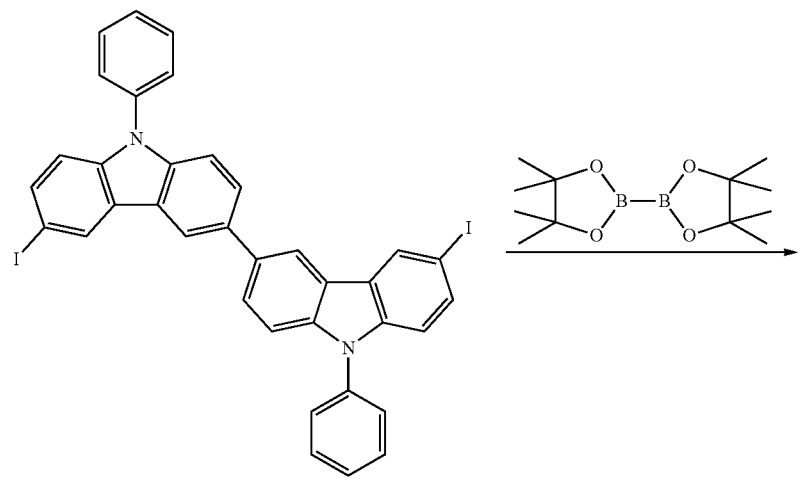
21

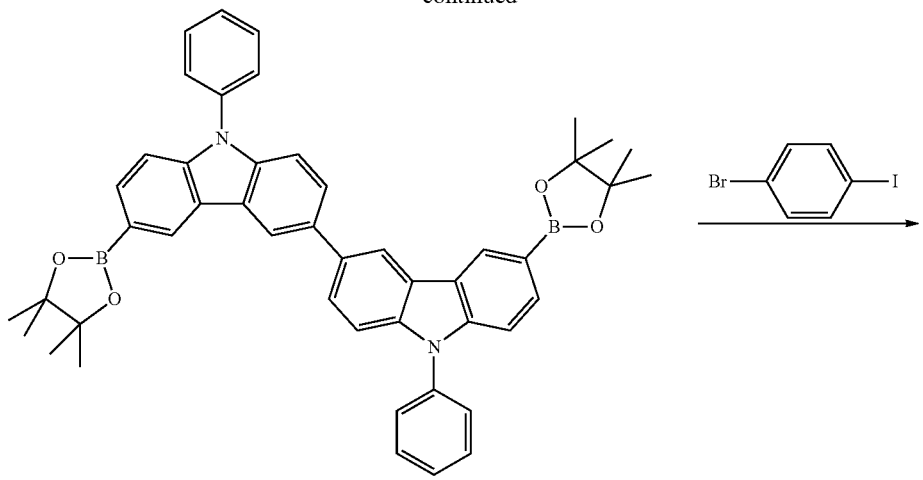

22

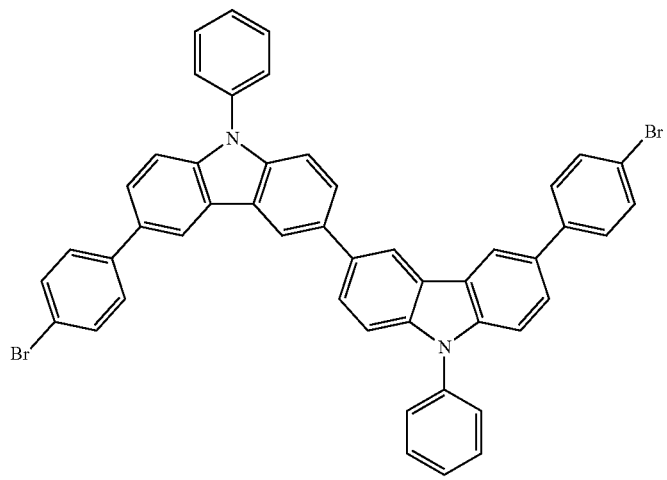

23

Phenylcarbazoleboronic Ester 19:

150 g (406 mmol) of 3-iodophenylcarbazole 18 are dissolved in 800 ml of dioxane, and 123.8 g (488 mol) of bis(pinacolato)diborane and 131.6 g (1.34 mol) of potassium acetate are added. 3.2 g (4.1 mmol) of 1,1-bis-(diphenylphosphino)ferrocenepalladium(II) chloride (complex with dichloromethane (1:1), Pd 13%) are subsequently added. The reaction is heated to 110° C. The progress of the reaction is followed by means of thin-layer chromatography. When the reaction is complete, the batch is cooled to room temperature, and 200 ml of water are added. The phases are separated. The organic phase extracted twice with 100 ml of water. The combined organic phases are washed three times with 100 ml of water, dried over magnesium sulfate, filtered, and the solvent is stripped off in vacuo. The crude product is recrystallised from heptane, giving a beige solid.

Bisphenylcarbazole 20:

91 g (242 mmol) of 3-iodophenylcarbazole 18 and 91 g (246 mmol) of phenylcarbazoleboronic ester 19 are suspended in acetone, and a 350 ml of 20% tetraethylammonium hydroxide solution (493 mmol) are added, the mixture is carefully degassed using argon. 4.6 g (4 mmol) of tetrakistriphenylphosphinepalladium are subsequently added. The reaction is heated to 70° C. The progress of the reaction is followed by means of thin-layer chromatography. When the reaction is complete, the batch is cooled to room temperature, and the precipitated product is filtered off with suction. The crude product is recrystallised from acetonitrile, giving a beige solid.

Diiodobisphenylcarbazole 21:

68 g (139 mmol) of bisphenylcarbazole 20 and 68 g (306 mmol) of N-iodosuccinimide are suspended in glacial acetic acid and stirred overnight at room temperature and with exclusion of light. The precipitate is filtered off with suction and washed with water and heptane. The crude product is recrystallised from acetonitrile, giving a white solid.

Bisphenylcarbazolebisboronic ester 22:

100 g (136 mmol) of diiodobisphenylcarbazole 21 are dissolved in 500 ml of dioxane, and 83 g (326 mol) of bis(pinacolato)diborane and 88 g (896 mmol) of potassium acetate are added. 2.2 g (2.7 mmol) of 1,1-bis-(diphenylphosphino)ferrocenepalladium(II) chloride (complex with dichloromethane (1:1), Pd 13%) are subsequently added. The reaction is heated to 110° C. The progress of the reaction is followed by means of thin-layer chromatography. When the reaction is complete, the batch is cooled to room temperature, and 200 ml of water are added. The phases are separated. The organic phase extracted twice with 100 ml of water. The combined organic phases are washed three times with 100 ml of water, dried over magnesium sulfate, filtered, and the solvent is stripped off in vacuo. The crude product is recrystallised from heptane, giving a beige solid.

Bis-3-(4-bromophenyl)bisphenylcarbazole 23:

30 g (41 mmol) of bisphenylcarbazolebisboronic ester 22 and 28.8 g (102 mmol) of 1-bromo-4-iodobenzene are dissolved in toluene, and an 82 ml of 2M sodium carbonate solution (163 mmol) are added, the mixture is carefully degassed using argon. 0.94 g (0.8 mmol) of tetrakistriphenylphosphinepalladium are subsequently added. The reaction is heated to 110° C. The progress of the reaction is followed by means of thin-layer chromatography. When the reaction is complete, the batch is cooled to room temperature, and the precipitated product is filtered off with suction. The crude product is recrystallised from dimethylformamide, giving a beige solid.

Example 10

Preparation of Compound 24

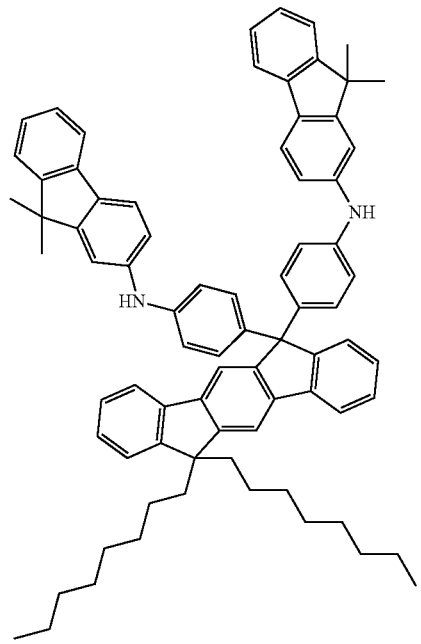

Compound 24 is prepared as follows:

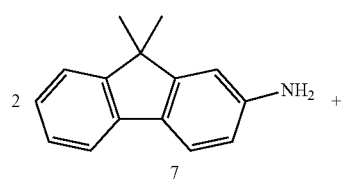

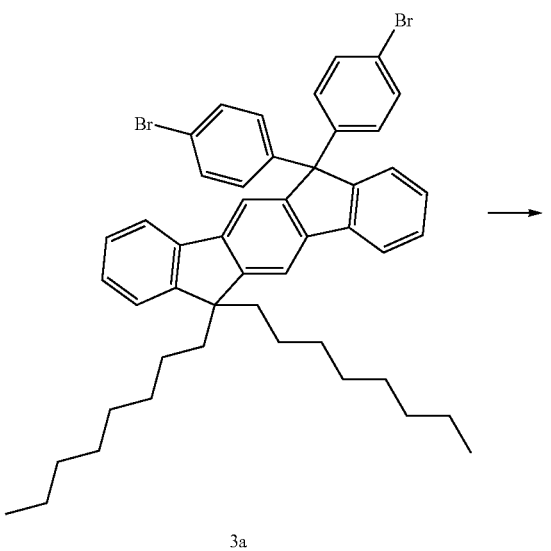

13.9 g of 4-aminodimethylfluorene 7 (66 mmol), 25.2 g (32 mmol) of dibromo 3a and 9.4 g of sodium tert-butoxide (97 mmol) are dissolved in toluene, and the reaction solution is carefully degassed. The reaction solution is warmed to 80° C., and the reaction is initiated by addition of the catalyst 148 mg (0.16 mmol) of $Pd_2dba_3$ and 201 mg (0.32 mmol) of BINAP and heated to the reflux temperature. The progress of the reaction is followed by means of thin-layer chromatography. When the reaction is complete, the mixture is cooled to room temperature, and 30 ml of water are added. The phases are separated, the aqueous phase is extracted twice with 30 ml of toluene. The combined organic phases are washed three times with 30 ml of water, dried over magnesium sulfate, and the solvent is stripped off in vacuo. The crude product is recrystallised from ethanol.

B) Preparation of the Polymers

Examples 11 to 16

Preparation of the Polymers (P1 to P5) and of the Comparative Polymer (V1)

Standard Procedure:

2 mmol of a halogenated monomer and 2 mmol of a diamine monomer, as well as 0.577 g (6 mmol) of sodium tert-butoxide are dissolved in 20 ml of toluene. The reaction solution obtained is carefully degassed under argon. The solution is warmed to about 80° C. under a protective-gas atmosphere, and the reaction is initiated by addition of 3.6 mg (16 µmol) of palladium acetate and 69 mg (96 µmol) of tri-tert-butylphosphine dissolved in 1 ml of toluene. The reaction mixture is heated at the boil for about 1 hour until the solution becomes viscous. The polymerisation is stopped by the addition of 3 mg of bromobiphenyl, and the reaction solution is heated at the boil for a further hour in order to terminate the end groups. The solution is cooled to 65° C. and diluted with 80 ml of toluene, and 80 ml of a 10% thiocarbamide solution are added, and the mixture is stirred at 65° C. for 3 hours. The mixture is cooled to room temperature and extracted three times with 50 ml of water and subsequently precipitated in double the amount of methanol. For purification, the polymer is dissolved in toluene and subsequently precipitated in double the amount of methanol. This procedure is repeated a further time.

Example 11

Polymer P1

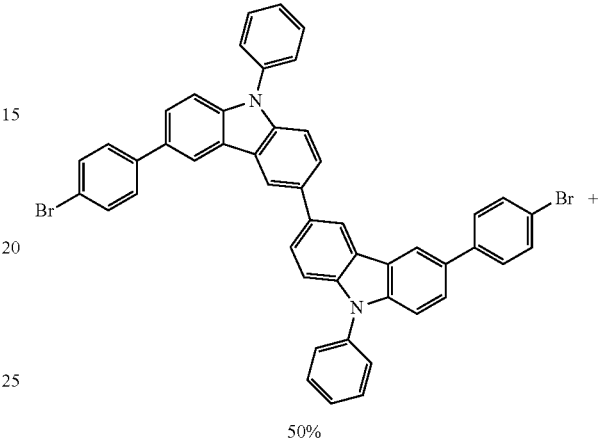

50%

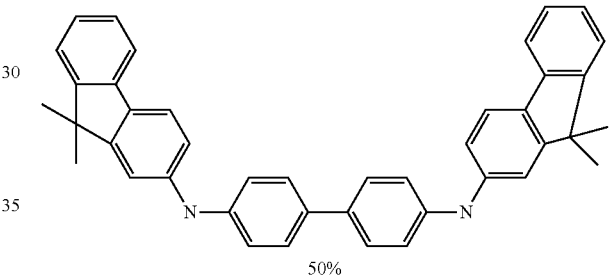

50%

Example 12

Polymer P2

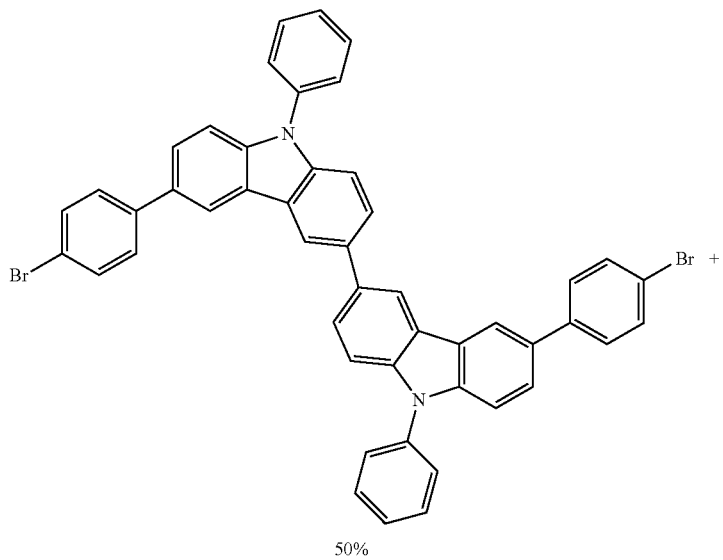

50%

-continued
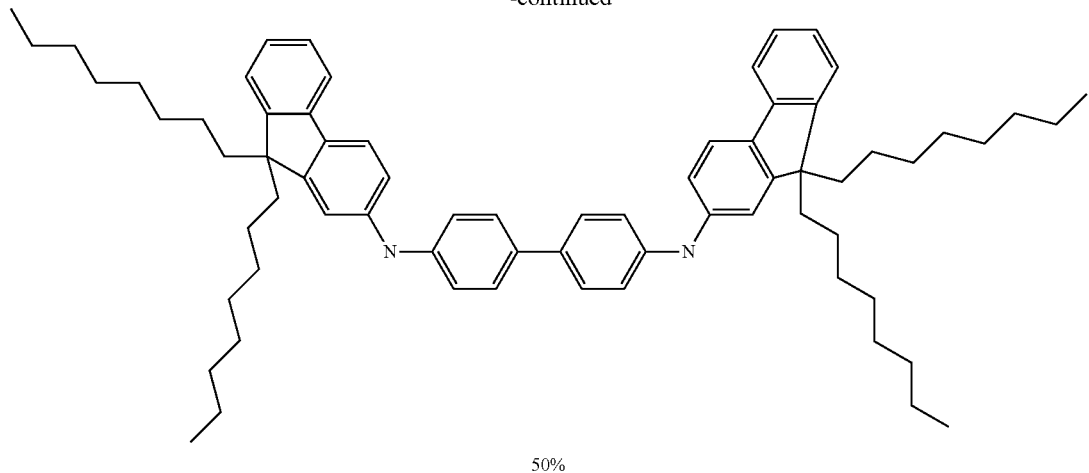
50%
Example 13
Polymer P3
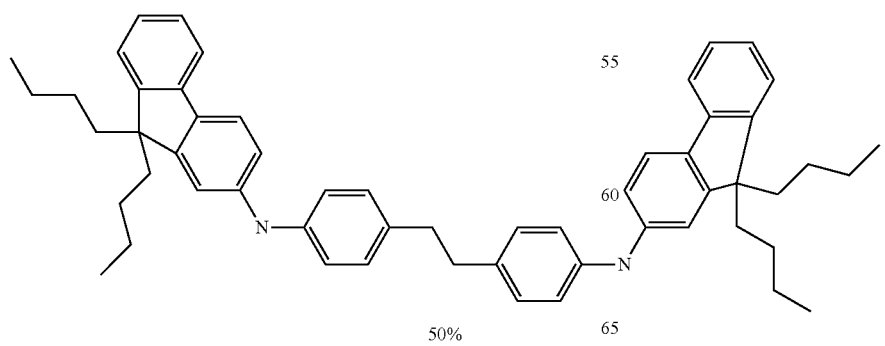
50%
50%

Example 14
Polymer P4
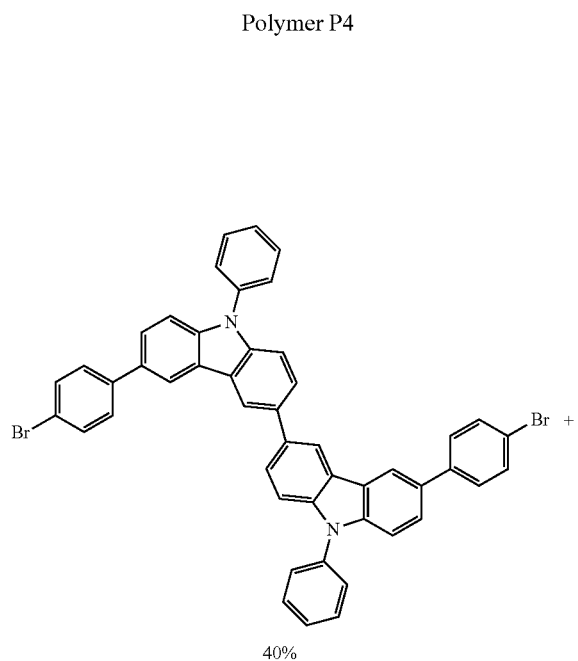
Example 15
Polymer P5
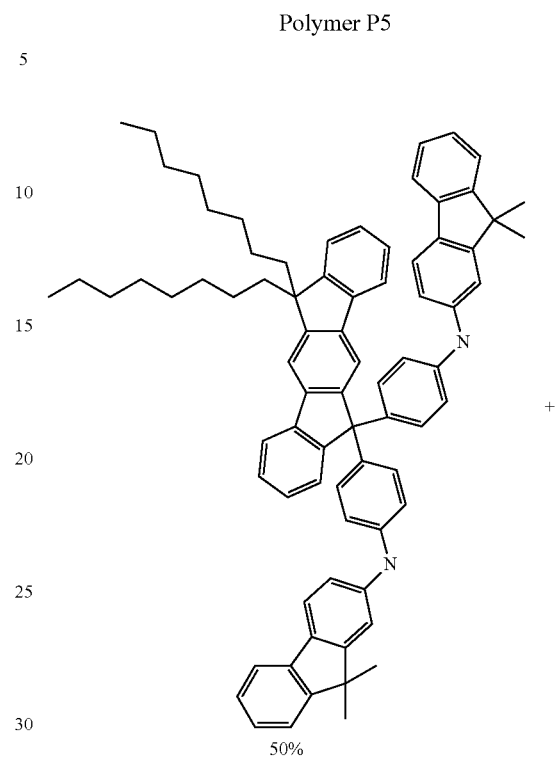
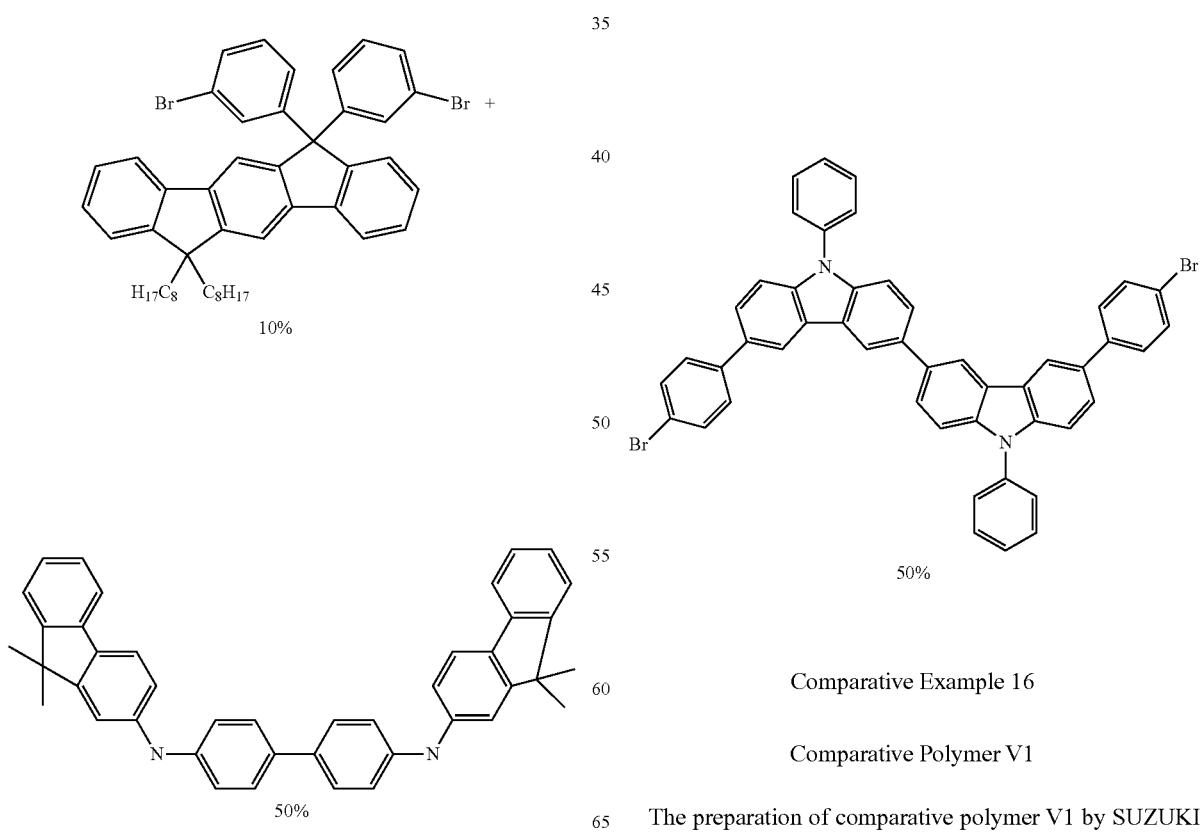
Comparative Example 16
Comparative Polymer V1
The preparation of comparative polymer V1 by SUZUKI coupling is carried out by the process described in WO 03/048225.

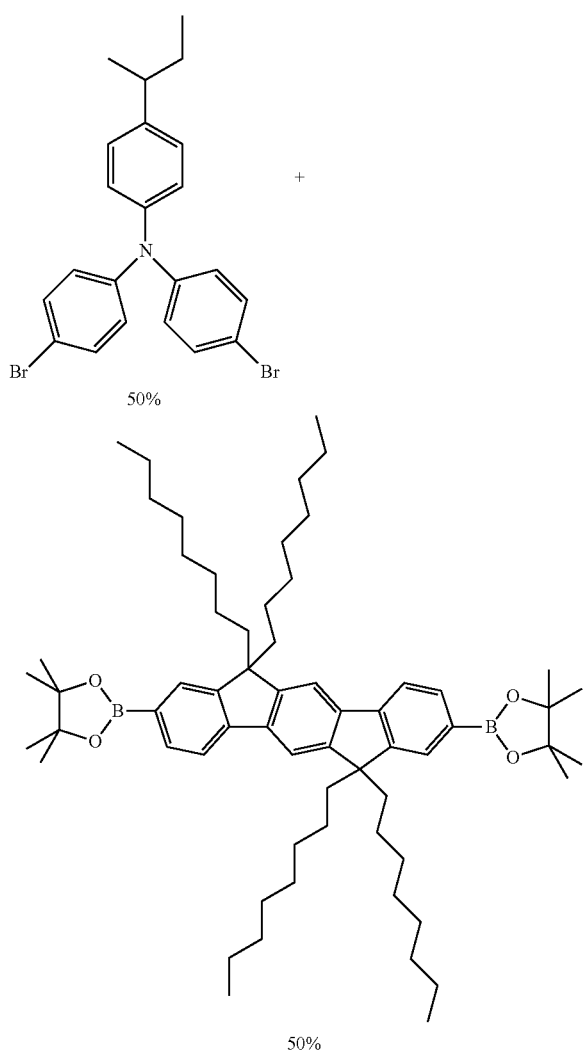

50%

+

50%

C) Production of PLEDs

Examples 17 to 28

The production of a polymeric organic light-emitting diode (PLED) has already been described many times in the literature (for example in WO 2004/037887 A2). In order to explain the present invention by way of example, PLEDs are produced with polymers P1 to P5 and comparative polymer V1 by spin coating.

A typical device has the structure depicted in FIG. 1, where the polymers according to the invention fulfil the function of a hole-transport layer (HTL). A cathode applied by vapour deposition during the production process has 4 pixels of 2×2 mm. The structure of the device is depicted in plan view in FIG. 2.

The substrates are cleaned in a clean room with deionised water and a detergent (Deconex 15 PF) and then activated by a UV/ozone plasma treatment. An 80 nm layer of PEDOT (PEDOT is a polythiophene derivative (Baytron P VAI 4083sp.) from H. C. Starck, Goslar, which is supplied as an aqueous dispersion) is then applied by spin coating, likewise in the clean room. The spin rate required depends on the degree of dilution and the specific spin-coater geometry (typical for 80 nm: 4500 rpm). In order to remove residual water from the layer, the substrates are dried by heating on a hotplate at 180° C. for 10 minutes.

Then, firstly 20 nm of an interlayer or HTL layer are applied under an inert-gas atmosphere (nitrogen or argon). The polymers according to the invention are processed in this layer from a toluene solution having a concentration between 5 and 8 g/l. 65 nm of the emitting layer are then subsequently applied from toluene solutions. The two layers are dried by heating at 180° C. for at least 10 minutes.

Finally, the Ba/Al cathode is applied by vapour deposition in the pattern indicated through a vapour-deposition mask (high-purity metals from Aldrich, particularly barium 99.99% (Order No. 474711); vapour-deposition units from Lesker or others, typical vacuum level $5 \times 10^{-6}$ mbar; Ba/Al layer thickness 3 nm/100 nm). In order to protect, in particular, the cathode against air and atmospheric moisture, the device is finally encapsulated and then characterised.

Figure 3:
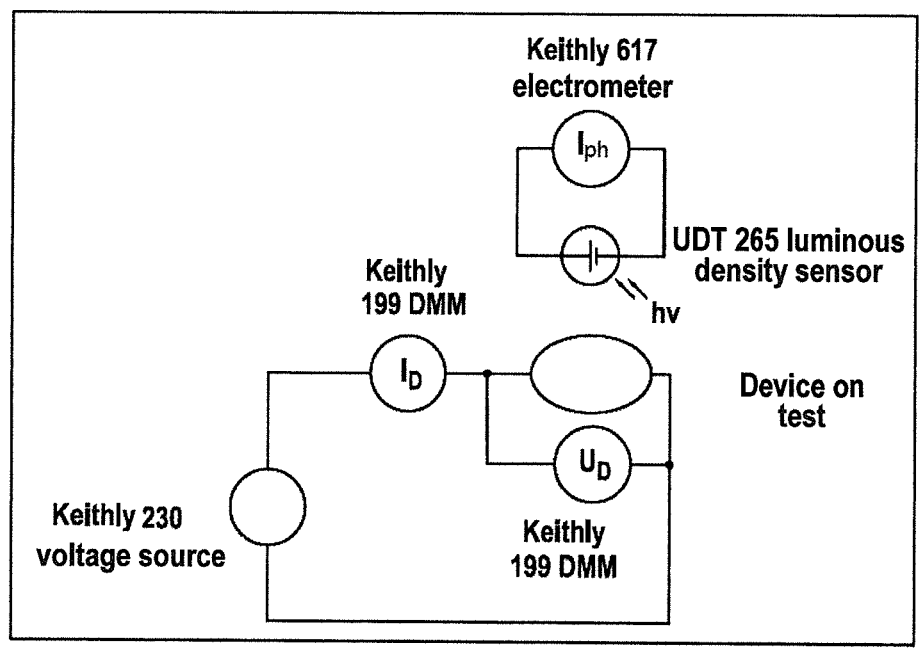
FIG. 3 shows the typical measurement set-up.

To this end, the devices are clamped into holders manufactured especially for the substrate size and provided with spring contacts. A photodiode with eye response filter can be placed directly on the measurement holder in order to exclude influences from extraneous light. The typical measurement set-up is depicted in FIG. 3.

The voltages are typically increased from 0 to max. 20 V in 0.2 V steps and reduced again. For each measurement point, the current through the device and the photocurrent obtained is measured by the photodiode. In this way, the IVL data of the test devices are obtained. Important characteristic quantities are the maximum efficiency measured ("max. eff." in cd/A) and the voltage required for 100 cd/m$^2$.

In order, in addition, to know the colour and the precise electroluminescence spectrum of the test devices, the voltage required for 100 cd/m$^2$ is applied again after the first measurement, and the photodiode is replaced by a spectrum measuring head. This is connected to a spectrometer (Ocean Optics) by an optical fibre. The colour coordinates (CIE: Commission International de l'éclairage, 1931 standard observer) can be derived from the measured spectrum.

The results obtained on use of polymers P1 to P5 and V1 as interlayer in PLEDs are compiled in Table 1. The emitting layers EML1 (M1 and E1) and EML2 (M2 and E1) used are the combinations of soluble matrices and emitters depicted below. Emitter E1 is admixed with matrix M1 or M2 in a concentration of 20% by weight.

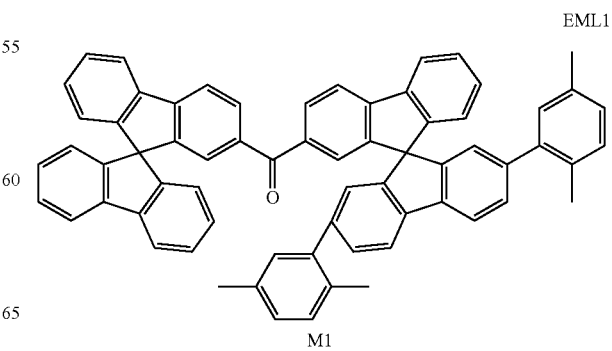

EML1

M1

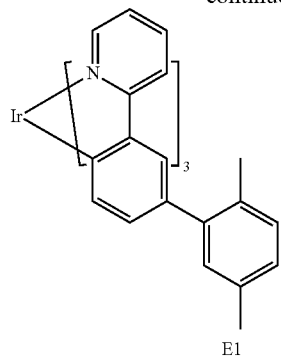

E1

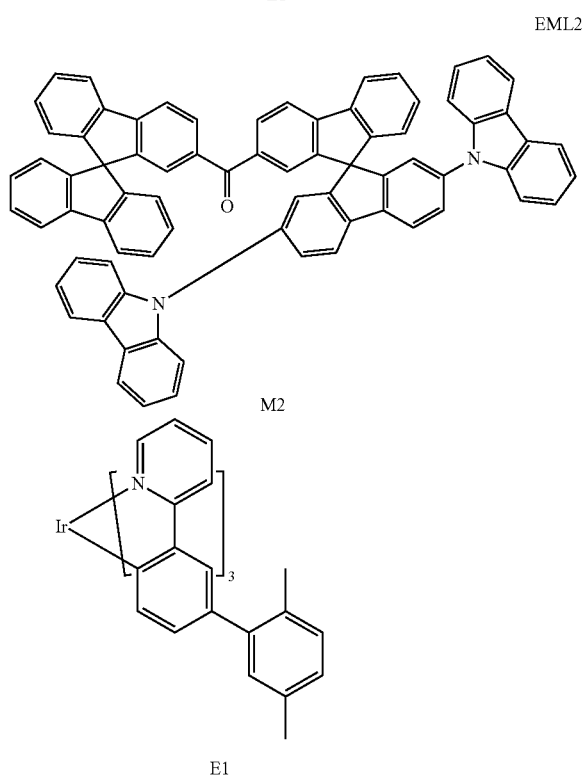

M2

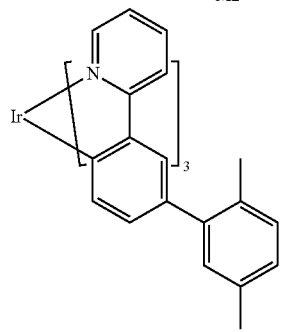

E1

TABLE 1

Device examples for polymers P1 to P5 according to the invention (Examples 17 to 21 and 23 to 27) and comparative polymer V1 (Examples 22 and 28).

| Ex. | Interlayer | Matrix | Max. eff. [cd/A] | Max. eff. [lm/W] | U @ 1000 cd/m² [V] | CIE [x/y] |
|---|---|---|---|---|---|---|
| 17 | P1 | EML1 | 25.5 | 19.0 | 4.2 | 0.34/0.62 |
| 18 | P2 | EML1 | 26.2 | 19.4 | 4.1 | 0.34/0.62 |
| 19 | P3 | EML1 | 40.4 | 27.7 | 4.6 | 0.34/0.62 |
| 20 | P4 | EML1 | 39.6 | 27.2 | 4.5 | 0.34/0.62 |
| 21 | P5 | EML1 | 43.2 | 30.1 | 4.0 | 0.34/0.62 |
| 22 | V1 | EML1 | 27.1 | 15.3 | 5.5 | 0.34/0.62 |
| 23 | P1 | EML2 | 28.8 | 21.8 | 4.1 | 0.33/0.62 |
| 24 | P2 | EML2 | 28.3 | 21.5 | 4.0 | 0.33/0.62 |
| 25 | P3 | EML2 | 31.7 | 23.6 | 4.2 | 0.33/0.62 |
| 26 | P4 | EML2 | 33.5 | 24.1 | 4.3 | 0.33/0.62 |
| 27 | P5 | EML2 | 42.0 | 31.3 | 4.1 | 0.33/0.62 |
| 28 | V1 | EML2 | 28.5 | 17.3 | 5.2 | 0.33/0.62 |

The polymers according to the invention exhibit an enormous advantage over comparative polymer V1, as can be seen from the results in Table 1, with respect to the voltage required for operation of the device and the light efficiency. The increase in operating voltage for a luminance of 1000 cd/m² can be up to 1.5 V. The advantages of the polymers according to the invention are furthermore clear on consideration of the power efficiency. The efficiency can be approximately doubled by using a polymer according to the invention.

The invention claimed is:

1. A polymer containing at least one carbazole structural unit of the general formula (Ia)

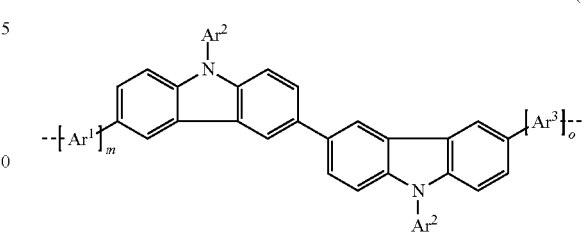
(Ia)

where
Ar¹, Ar² and Ar³ is each, independently of one another, an aryl or heteroaryl group, which is optionally substituted by one or more radicals R;
m and o are independently of one another, 0 or 1;
n is 1, 2 or 3 and
the dashed lines represent a covalent single bond linking to the polymer;
and at least one arylamine structural unit of the general formula (IIa) and/or (IIIa)

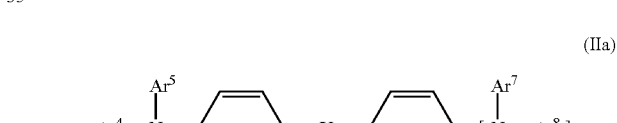
(IIa)

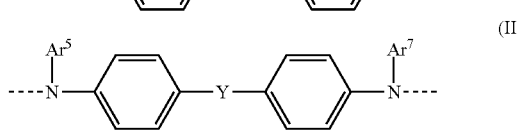
(IIIa)

where
Ar⁴, Ar⁵, Ar⁷ and Ar⁸ is each, independently of one another, an aryl or heteroaryl group, which is optionally substituted by one or more radicals R;
R is selected on each occurrence, independently of one another, from F, Cl, Br, I, N(Ar)$_2$, N(R')$_2$, CN, NO$_2$, Si(R')$_3$, B(OR')$_2$, C(=O)Ar, C(=O)R', P(=O)(Ar)$_2$, P(=O)(R')$_2$, S(=O)Ar, S(=O)R', S(=O)$_2$Ar, S(=O)$_2$R', —CR'=CR'Ar, OSO$_2$R', a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R', where one or more non-adjacent CH$_2$ groups is optionally replaced by R'C=CR', C≡C, Si(R')$_2$, Ge(R')$_2$, Sn(R')$_2$, C=O, C=S, C=Se, C=NR', P(=O)(R'), SO, SO$_2$, NR', O, S or CONR' and where one or more H atoms is optionally replaced by F, Cl, Br, I, CN or NO$_2$, a crosslinkable group or an aromatic or heteroaromatic ring system having 5 to 60 ring atoms, which may in each case be substituted by one or more radicals R', or an aryloxy or heteroaryloxy group having 5 to 60 ring atoms, which is optionally substituted by one or more radicals R', or a combination of these systems, where two or more substituents R may also form a mono- or polycyclic, aliphatic or aromatic ring system with one another, where R' is in each case, independently of one another, H or an aliphatic or aromatic hydrocarbon radical having 1 to 20 C atoms and Ar is an aryl or heteroaryl group having 2 to 30 C atoms;

Y is a linear or branched alkylene group having 1 to 20 C atoms, in which one or more non-adjacent $CH_2$ groups may be replaced by —O—, —S—, —NH—, —N($CH_3$)—, —N—CO—, —N—CO—O—, —N—CO—N—, —CO—, —O—CO—, —S—CO—, —O—COO—, —CO—S, —CO—O—, —CH(halogen)-, —CH(CN)—, —CH=CH— or —C≡C—, or a cyclic alkyl group;

q is 0 or 1 and the dashed lines represent a covalent single bond linking to the polymer.

2. The polymer according to claim 1, wherein the Y is —O—, —($CH_2$)$_o$—, —($CH_2CH_2O$)$_p$—$CH_2CH_2$—, —$CH_2CH_2$—S—$CH_2CH_2$— or —$CH_2CH_2$—NH—$CH_2CH_2$—, where o is 1 to 12 and p is 1 to 3.

3. The polymer according to claim 2, wherein o is 2 to 12.

4. The polymer according to claim 1, wherein the Y is methylene, ethylene, propylene, butylene, pentylene, hexylene, heptylene, octylene, nonylene, decylene, undecylene, dodecylene, octadecylene, ethyleneoxyethylene, methyleneoxybutylene, ethylenethioethylene, ethylene-N-methyliminoethylene, 1-methylalkylene, ethenylene, propenylene or butenylene.

5. The polymer according to claim 1, wherein the Y is a linear or branched alkylene group having 1 to 20 C atoms in which one or more non-adjacent $CH_2$ groups may be replaced by —O—, —S—, —NH—, —N($CH_3$)—, —N—CO—, —N—CO—O—, —N—CO—N, —CO—, —O—CO—, —S—CO—, —O—COO—, —CO—S—, —CO—O—, —CH(halogen)-, —CH(CN)—, —CH=CH— or —C≡C—, or a cyclic alkyl group.

6. The polymer according to claim 1, wherein the polymer contains at least one carbazole structural unit of the general formula (Ib)

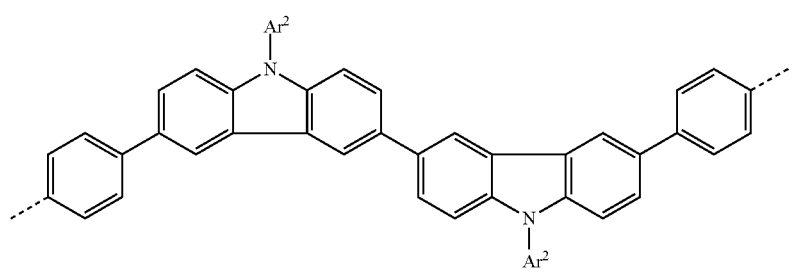

(Ib)

where

Ar$^2$ is each, independently of one another, an aryl or heteroaryl group, which is optionally substituted by one or more radicals R;

R is selected on each occurrence, independently of one another, from F, Cl, Br, I, N(Ar)$_2$, N(R')$_2$, CN, NO$_2$, Si(R')$_3$, B(OR')$_2$, C(=O)Ar, C(=O)R', P(=O)(Ar)$_2$, P(=O)(R')$_2$, S(=O)Ar, S(=O)R', S(=O)$_2$Ar, S(=O)$_2$R', —CR'=CR'Ar, OSO$_2$R', a straight-chain alkyl, alkoxy or thioalkoxy group having 1 to 40 C atoms or a branched or cyclic alkyvl, alkoxy or thioalkoxy group having 3 to 40 C atoms, each of which is optionally substituted by one or more radicals R', where one or more non-adjacent CH$_2$ groups is optionally replaced by R'C=CR', C≡C, Si(R')$_2$, Ge(R')$_2$, Sn(R')$_2$, C=O, C=S, C=Se, C=NR', P(=O)(R'), SO, SO$_2$, NR', O, S or CONR' and where one or more H atoms is optionally replaced by F, Cl, Br, I, CN or NO$_2$, a crosslinkable group or an aromatic or heteroaromatic ring system having 5 to 60 ring atoms, which may in each case be substituted by one or more radicals R', or an aryloxy or heteroaryloxy group having 5 to 60 ring atoms, which is optionally substituted by one or more radicals R', or a combination of these systems, where two or more substituents R may also form a mono- or polycyclic, aliphatic or aromatic ring system with one another, where R' is in each case, independently of one another, H or an aliphatic or aromatic hydrocarbon radical having 1 to 20 C atoms and Ar is an aryl or heteroaryl group having 2 to 30 C atoms; and the dashed lines represent a covalent single bond linking to the polymer.

7. The polymer according to claim 1, wherein the polymer contains at least one arylamine structural unit of the general formula (IIIb)

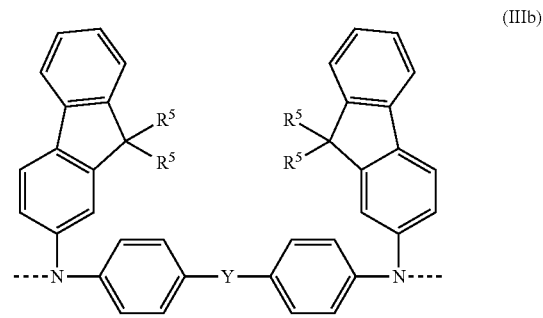

(IIIb)

where

Y is a linear or branched alkylene group having 1 to 20 C atoms, in which one or more non-adjacent CH$_2$ groups may be replaced by —O—, —S—, —NH—, —N(CH$_3$)—, —N—CO—, —N—CO—O—, —N—CO—N—, —CO—, —O—CO—, —S—CO—, —O—COO—, —CO—S, —CO—O—, —CH(halogen)-, —CH(CN)—, —CH=CH— or —C≡C—, or a cyclic alkyl group;

R⁵ is in each case, independently of one another, a hydrogen atom, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH₂), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF₃ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups R⁵ optionally forms a mono- or polycyclic, aliphatic or aromatic ring system with one another and/or with the ring to which the group R⁵ is bonded, and the dashed lines represent a covalent single bond linking to the polymer.

8. The polymer according to claim 1, wherein the polymer contains at least one connecting structural unit.

9. The polymer according to claim 8, wherein the polymer contains at least one connecting structural unit of the formula (IV)

(IV)

where X is a spacer group and the dashed lines represent a covalent single bond linking to the polymer.

10. The polymer according to claim 8, wherein the polymer contains at least one connecting structural unit of the formula (Va)

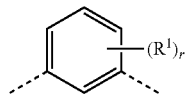
(Va)

where
R¹ is a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH₂), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF₃ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups R¹ may form a mono- or polycyclic, aliphatic or aromatic ring system with one another and/or with the ring to which the group R¹ is bonded;
r is 0, 1, 2, 3 or 4 and
the dashed lines represent a covalent single bond linking to the polymer.

11. The polymer according to claim 8, wherein the polymer contains at least one connecting structural unit of the formula (Vb)

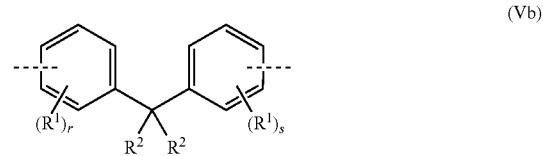
(Vb)

where
R¹, R² is each, independently of one another, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH₂), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF₃ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups
R¹ and/or R² may form a mono- or polycyclic, aliphatic or aromatic ring system with one another and/or with the ring to which the group R¹ is bonded;
r, s is, independently of one another, 0, 1, 2, 3 or 4 and
the dashed lines represent a covalent single bond linking to the polymer.

12. The polymer according to claim 11, wherein the polymer contains at least one connecting structural unit of the formula (Vb1)

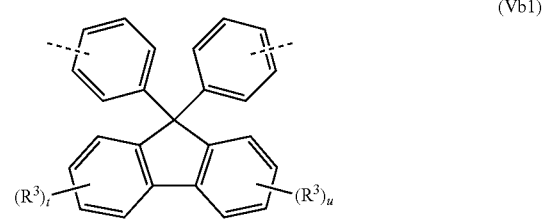
(Vb1)

where
R³ is in each case, independently of one another, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH₂), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF₃ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups $R^3$ may form a mono- or polycyclic, aliphatic or aromatic ring system with one another and/or with the ring to which the group $R^3$ is bonded;

t, u is, independently of one another, 0, 1, 2, 3 or 4 and the dashed lines represent a covalent single bond linking to the polymer.

13. The polymer according to claim 12, wherein the polymer contains at least one connecting structural unit of the formula (Vb2)

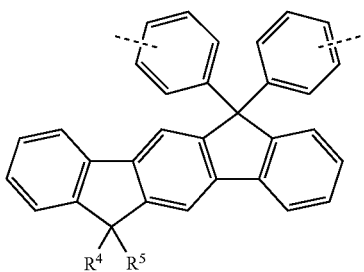

(Vb2)

where $R^4$, $R^5$ is each, independently of one another, a straight-chain alkyl, alkoxy or thioalkoxy group having 1 to 40 C atoms or a branched or cyclic alkyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, an amino group, a hydroxyl group, a nitro group, a CF$_3$ group, Cl, Br, F, a crosslinkable group or a substituted or unsubstituted, aromatic or heteroaromatic ring system having 5 to 60 ring atoms, or an aryloxy or heteroaryloxy group having 5 to 60 ring atoms, or a combination of these systems, where one or more of the groups $R^4$, $R^5$ may form a mono- or polycyclic, aliphatic or aromatic ring system with one another and/or with the ring to which the group $R^4$ or $R^5$ is bonded, and the dashed lines represent a covalent single bond linking to the polymer.

14. A process for the preparation of the polymer according to claim 1, which comprises polymerizing a monomer composition by the Suzuki or Buchwald process.

15. A formulation comprising the polymer according to claim 1 in one or more solvents.

16. An electronic device comprising the polymer according to claim 1.

17. The electronic device according to claim 1, wherein the polymer is present in the device as a constituent of the hole-transport or hole-injection layer.

18. The electronic device according to claim 16, wherein the electronic device is an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

19. A process for the production of the electronic device according to claim 16, which comprises applying one or more layers the polymer to a substrate from solution or by means of a printing process.

* * * * *